United States Patent
Vasic et al.

(10) Patent No.: US 7,331,012 B2
(45) Date of Patent: Feb. 12, 2008

(54) SYSTEM AND METHOD FOR ITERATIVE DECODING OF REED-MULLER CODES

(75) Inventors: Bane Vasic, Tucson, AZ (US); Jongseung Park, Pittsburgh, PA (US); Erozan Mehmet Kurtas, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 709 days.

(21) Appl. No.: 10/634,723

(22) Filed: Aug. 5, 2003

(65) Prior Publication Data

US 2004/0064779 A1   Apr. 1, 2004

Related U.S. Application Data

(60) Provisional application No. 60/414,803, filed on Sep. 30, 2002.

(51) Int. Cl.
H03M 13/00   (2006.01)
(52) U.S. Cl. .................................................. 714/781
(58) Field of Classification Search ............. 714/781, 714/755, 780, 746, 753
See application file for complete search history.

(56) References Cited

U.S. PATENT DOCUMENTS

| | | | |
|---|---|---|---|
| 3,508,153 A | 4/1970 | Gerrish et al. | |
| 3,792,356 A | 2/1974 | Kobayashi et al. | |
| 4,123,710 A | 10/1978 | Stuart et al. | |
| 4,472,813 A | 9/1984 | Koike et al. | |
| 4,571,734 A | 2/1986 | Dolivo et al. | |
| 5,729,560 A | 3/1998 | Hagenauer et al. | |
| 5,761,248 A | 6/1998 | Hagenauer et al. | |
| 5,812,601 A | 9/1998 | Schramm | |
| 5,926,488 A * | 7/1999 | Khayrallah | 714/752 |
| 6,023,783 A | 2/2000 | Divsalar et al. | |
| 6,145,111 A | 11/2000 | Crozier et al. | |
| 6,288,655 B1 | 9/2001 | Tsang et al. | |
| 6,854,082 B1 * | 2/2005 | Rhee | 714/755 |
| 6,912,685 B2 * | 6/2005 | Takeda et al. | 714/781 |
| 6,961,387 B2 * | 11/2005 | Kim et al. | 375/262 |
| 2001/0034871 A1 * | 10/2001 | Takeda et al. | 714/781 |
| 2002/0188906 A1 | 12/2002 | Kurtas et al. | |

OTHER PUBLICATIONS

X. Wei and A.N. Akansu, Density evolution for low-density parity-check codes under Max-Log-MAP decoding, Electronics Letters, Aug. 30, 2001, vol. 37, No. 18.

(Continued)

Primary Examiner—Jacques Louis-Jacques
Assistant Examiner—Fritz Alphonse
(74) Attorney, Agent, or Firm—Kinney & Lange, P.A.

(57) ABSTRACT

A system for soft-decoding of Reed-Muller coded information has one or more rows of decoding blocks, each decoding block having a soft-output device and a Reed-Muller message passing device. A first soft-output device of a first decoding block processes a coded signal and a zero value probability vector. Each subsequent soft-output device processes the coded information and a non-zero value probability vector. The system for soft-decoding Reed-Muller coded information decodes a code-bit reliability vector from a soft-output device to generate an updated codeword reliability vector, which is used by a next decoding block in a sequence of decoding blocks to reprocess the coded information using the updated reliability vector. The reliability vector is updated through processing in each decoding block to optimize the reliability vector for extraction of the transmitted information from the received information.

24 Claims, 15 Drawing Sheets

OTHER PUBLICATIONS

Peter J. Schreier, et al., Map Decoding of Linear Block Codes Based On A Sectionalized Trellis of the Dual Code, 2000 IEEE, 271-278.

Rainer Lucas, et al., On Iterative Soft-Decision Decoding of Linear Binary Block Codes and Product Codes, IEEE Journal on Selected Areas In Communications, vol. 16, No. 2, Feb. 1998, pp. 276-296.

Thomas Mittelholzer, et al., Reduced-Complexity Decoding of Low Density Parity Check Codes for Generalized Partial Response Channels, IEEE Transactions On Magnetics, vol. 37, No. 2, Mar. 2001, pp. 721-728.

"Application of Probabilistic Decoding to Digital Magnetic Recording Systems", H. Kobayashi, *Probablistic Decoding in Magnetic Recording*, Jan. 1971.

"Reed-Muller Codes", *Error Control Systems for Digital Communication and Storage*, Stephen B. Wicker, Prentice Hall, pp. 149-174.

Reed-Muller Error Correcting Codes:, Ben Cooke, MIT Undergraduate Journal of Mathematics, pp. 21-26.

"Sequential Stack Decoding of Binary Reed-Muller Codes", Norbert Stolte, Ulrich Sorger, et al., $3^{rd}$ *ITG Conference on Source and Channel Coding*, Jan. 2000, Munich, Germany, pp. 63-69.

"Iterative Decoding of Compound Codes by Probability Propagation in Graphical Models", Frank R. Kschischang and Brendan J. Frey, *IEEE Journal on Selected Areas in Communications*, vol. 16, No. 2, Feb. 1998.

"The Viterbi Algorithm", G. David Forney, Jr., *Proceedings of the IEEE*, vol. 61, No. 3, Mar. 1973, pp. 268-278.

"A Recursive Approach to Low Complexity Codes", R. Michael Tanner, *IEEE Transactions on Information Theory*, vol. IT-27, No. 5, Sep. 1981.

"Partial-Response Signaling", Peter Kabal and Subbarayn Pasupathy, *IEEE Transactions on Communications*, vol. COM-23, No. 9, Sep. 1975.

"Adaptive Maximum-Likelihood Receiver for Carrier-Modulated Data-Transmission Systems", Gottfried Ungerboeck, *IEEE Transactions on Communications*. vol. COM-22, No. 5, May 1974.

"The Viterbi Algorithm Applied to Digital Data Transmission", Jeremiah F. Hayes, *IEEE Communications Magazine*, Mar. 1975, vol. 13, No. 2, pp. 26-32.

"Optimal Decoding of Linear Codes for Minimizing Symbol Error Rate", L.R. Bahl, J. Cocke, et al., *IEEE Transactions on Information Theory*, Mar. 1974, pp. 284-287.

"A Viterbi Algorithm with Soft-Decision Outputs and its Applications", Joachim Hagenauer and Peter Hoeher, *Communications Technology for the 1990's and Beyond*, pp. 1680-1685.

"A Low Density generator Matrix Interpretation of Parallel Concatenated Single Bit Parity Codes", Travis R. Oenning and Jackyun Moon, Jun. 20, 2000, pp. 1-5.

\* cited by examiner

SYSTEM AND METHOD FOR ITERATIVE DECODING OF REED-MULLER CODES

CROSS-REFERENCE TO RELATED APPLICATION(S)

This application claims priority from provisional application Serial No. 60/414,803 filed on Sep. 30, 2002, entitled "A NEW ITERATIVE DECODING OF REED-MULLER CODES."

BACKGROUND OF THE INVENTION

This invention is concerned with the decoding of the information bearing sequences, which occur in modern digital communication systems. In particular, the present invention is concerned with a system and method for decoding information bearing sequences received from an intersymbol-interference communication channel, from a noisy communication channel, or from recording devices.

In modern communication and recording systems, information symbols in neighboring data tracks on a disc or adjacent bits in a transmission sequence sometimes interfere with each other during the transmission through the channel. In this case, the term "channel" refers to the medium from which the information symbols are received. This interference is known as "intersymbol interference" (ISI), and ISI impairs the performance of a communication system.

While the elimination of ISI would be optimal, in many systems, ISI cannot be completely eliminated. However, steps can be taken to reduce the effect of ISI on the error rate of information transmissions.

One way of reducing the effect of ISI is to equalize the channel's impulse response to a pre-defined transfer function. The pre-defined transfer function does not eliminate ISI. Instead, using the known intersymbol interference, the receiver can reduce the effect of ISI by using a proper decoding algorithm. This method of communication is referred to as partial-response (PR) signaling. A general description of PR signaling is given by P. Kabel et al., in the paper "Partial Response Signaling," *IEE Transaction on communications*, Vol. COM-23, No. 9, September 1975, pp 921-934. Generally, partial-response signaling allows for better handling of the intersymbol interference and for more efficient utilization of the bandwidth of a given channel.

Maximum-likelihood sequence detection (MLSD), in particular the Viterbi algorithm (VA), is a method for the detection of the sequences in the presence of intersymbol interference. A general description of this technique was provided by G. D. Forney in "The Viterbi Algorithm," published in the *proceedings of the IEEE*, Vol. 61, No. 3, March 1973, pp. 268-278, and by G. Ungerboeck, "Adaptive Maximum-likelihood Receiver for Carrier-modulated Data Transmission Systems," in the *IEEE Transactions on Communications*, Vol. COM-22, No. 5, May 1974, pp. 624-636. The Viterbi Algorithm currently is used in many communication and recording systems.

The Soft-Output Viterbi Algorithm (SOVA) is a modification of the VA that gives the most likely path sequence in the trellis, as well as the a posteriori probability for each transmitted bit. A general description of the SOVA technique was described by J. Hagenauer and P. Hoeher in the article "A Viterbi algorithm with soft decision outputs and its applications," in the *Proc.* GLOBECOM'89, pp. 1680-1686. Optimal a posteriori probabilities are also given by the so-called BCJR algorithm. A general description of the BCJR algorithm was provided in the article authored by L. Bahl, J. Cocke, F. Jelinek, and J. Raviv, entitled "Optimal decoding of linear codes for minimizing symbol error rate," *IEEE Trans.on Information Theory*, pp. 284-287, March 1974. Both the Viterbi and the BCJR algorithms, when combined with a soft decoding scheme for convolution modulation codes, form efficient iterative "turbo" decoding schemes. Both the SOVA and the BCJR algorithm can be used in the partial response (PR) channels.

Although the bit-error rate (BER) of the turbo algorithm approach Shannon's theoretical limit, the complexity of their implementation and the time delays introduced by these algorithms through the decoding process pose serious problems for real-time information retrieval.

One potential solution to this problem involves low-density parity-check (LDPC) codes. LDPC codes have orthogonal parity checks on all message bits, which allows a message bit to be determined by majority voting at a single decoding step. LDPC codes belong to a class of codes referred to as "one step majority decodable codes", which are discussed in a book authored by S. Lin and D. J. Costello. Jr. entitled "Error control coding: fundamentals and applications", and published by Prentice Hall in 1983.

Generally, one step majority decodable codes support message-passing decoding, an iterative decoding algorithm on a code graph. "Messages" are descriptions of local function products (possibly marginalized local function products). The functions are "local" in the sense that access to the functions is local to a specific vertex in the graph. Knowledge of local functions (or functions derived from local functions such as probabilities) can be propagated to non-local vertices by "message passing" along the edge of the graph. Essentially, messages are passed between the vertices of the "propagation tree".

While one step majority decodable codes work for some applications, it is known that it is not possible to construct short and powerful LDPC codes that, at the same time, have a high code rate. The high rate LDPC codes capable of correcting burst and ISI errors are long. However, long codes result in coding delays, which may not be tolerable in practical applications. In particular, coding delays in magnetic recording would be intolerable. The code rate is very important in magnetic recording because low code rates amplify the signal-to-noise ratio (SNR) loss. The issues related to the code rate loss in baseband communication and recording channels are well known.

Therefore, it is desirable to have a coding system that offers high coding rates with shorter codes; and it is desirable to have a Turbo decoder capable of decoding the shorter codes at a high code rate.

BRIEF SUMMARY OF THE INVENTION

In the present invention, Reed-Muller coded information is decoded by extracting log-bit reliabilities from information received from a partial-response or noisy channel. The log-bit reliabilities are decoded by a Reed-Muller message passing algorithm. The decoded bit reliabilities are then assembled into a code reliability, interleaved and reprocessed with the originally received data to iteratively perfect the log-bit reliability vector before outputting the decoded information.

A system for decoding Reed-Muller coded information includes a first soft-output device for processing a coded signal and for producing code bit decisions and code bit reliabilities based on the coded signal. The system also includes a first Reed-Muller message passing device for decoding the code bit decisions and decoding the code bit reliabilities into an information bit decision and an information bit reliability vector.

The decoding system has an assembler for combining the message bit reliabilities into a code word reliability vector for use in a second soft-output device, wherein each element of the code word reliability vector is a code bit reliability number.

The system has an assembler for combining the message bit reliabilities into a reliability vector and a second soft-input device for processing the coded signal based on the code word reliability vector. The second soft-input device also produces updated code bit decisions and updates code bit reliabilities based on the coded signal and the code word reliability vector. A second Reed-Muller message passing device processes the updated code bit decisions and updated code bit reliabilities into an updated information bit decision and an updated information bit reliability vector.

In one embodiment, the coded signal processed by the system is an interleaved coded signal and a de-interleaver is positioned between the soft-output device and the Reed Muller message passing device for recovering an original sequence of coded information from a received sequence.

In another embodiment, the Reed-Muller message passing decoder uses log bit reliabilities to evaluate the coded signal.

In one embodiment, a method for decoding of a Reed-Muller code includes the steps of generating a code bit vector and a log-bit probability vector based on a received coded signal using a first soft-output device; passing at least the log-bit probability vector to a second soft-output device; and generating an updated code bit vector and an updated log-bit probability vector based on the received coded signal and at least the log-bit probability vector.

In some instances, the step of generating a code bit vector involves decoding the received coded signal using a soft-output device to produce the code bit vector and a bit reliability vector. The code bit vector and the bit reliability vector is decoded into a Reed-Muller de-coded information bit vector and an information bit reliability vector. Finally, the information bit reliability vector is decoded into a code word reliability vector.

In one embodiment, the coded signal is an interleaved signal, and the method involves a step of de-interleaving the code bit vector and the bit reliability vector.

Between iterations of the decoder loop, the system includes the step of interleaving at least the codeword reliability for use in a next soft-output device. Reed-Muller decoding the updated code bit vector and an updated log-bit probability vector. The code bit reliability vector is a log-bit-likelihood.

In one embodiment, a soft iterative decoding system has two or more decoding blocks for processing coded information into a decoded bit vector and a decoded probability vector. Each decoding block has a soft-output device for processing the coded information according to a code word probability vector into a code bit information vector and an associated code bit reliability vector. Each decoding block also has a Reed-Muller device for decoding the code bit information vector and the associated code bit reliability vector. An assembler device between each decoding block processes the code bit information vector and the associated code bit reliability vector received from a previous decoding block into a codeword vector and an associated codeword reliability vector for a next decoding block.

DETAILED DESCRIPTION

Figure 1:
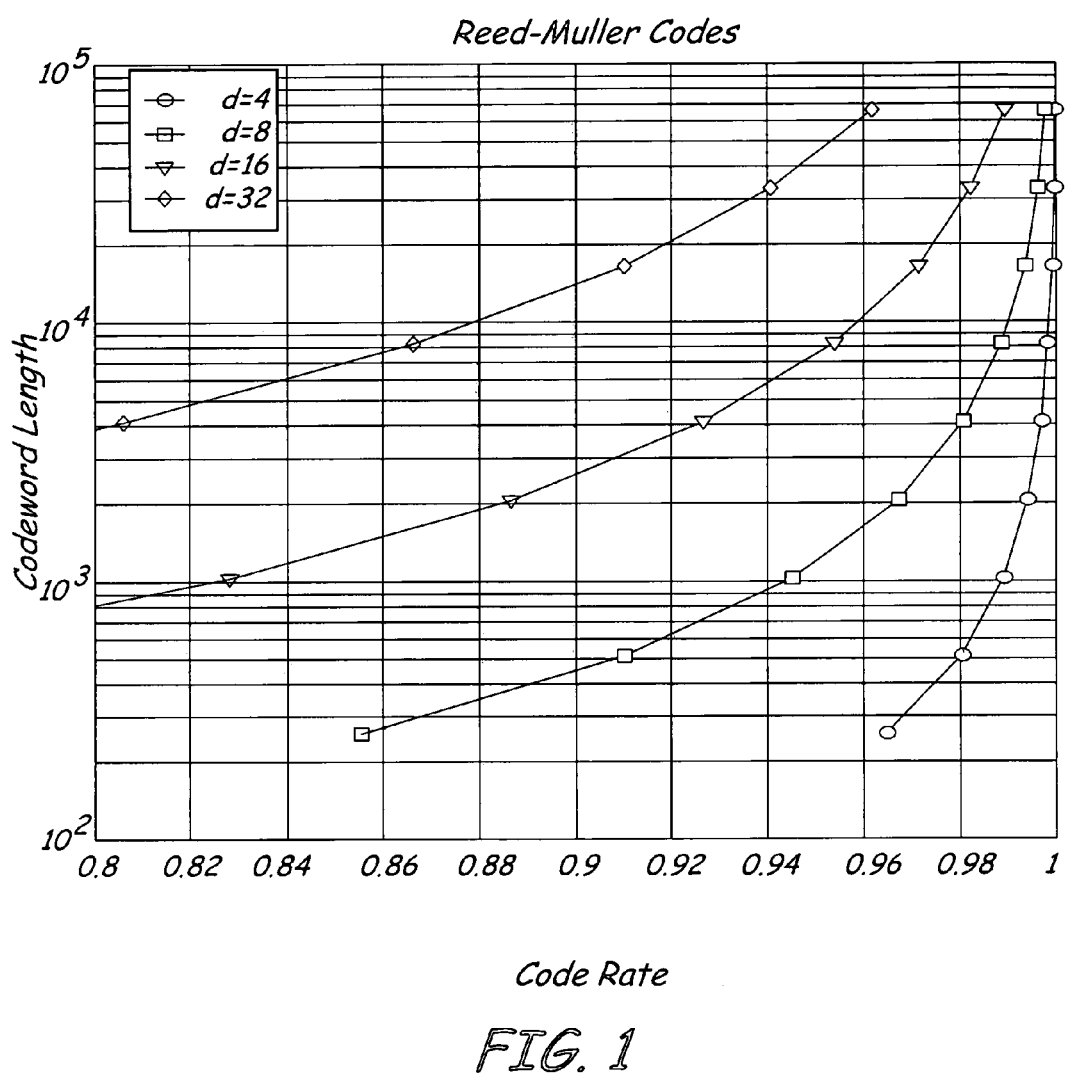
FIG. 1 is a graph of the codeword length versus the code rate for Reed-Muller codes.

Generally, Reed-Muller (RM) codes belong to a subset of codes known as "finite geometry codes", in which the null space of the code is defined by the points on a set of hyper-planes in a vector space. When the vector space on which the hyper-planes are defined is based on a binary field (field of the space is GF(2)), the codes are referred to as "Reed-Muller codes." RM-codes are linear cyclic codes that are multi-step majority logic decodable and that do not have orthogonal parity checks.

Generally, the vector space consists of strings of length $2^m$ consisting of numbers within a defined set (such as $\{0,1\}$ or $\{-1,0,1\}$ and the like), where m is a positive integer. The codewords of a Reed-Muller code form a subspace of such a vector space.

An $i^{th}$ orderReed-Muller code $\Re(i,m)$ is a set of all binary strings (vectors) of length $n=2^m$ associated with Boolean polynominals $p(x_1, x_2, \ldots x_m)$. The $0^{th}$ order Reed-Muller code $\Re(0,m)$ consists of binary strings associated with either 0 or 1, such that $\Re(0,m)$ is a repetition of either zeros or ones of length $2^m$.

Typically, to define an encoding matrix of $\Re(i,m)$, the first row of the encoding matrix is set to 1, such that the first row defines a vector of length $2^m$ with all matrix entries in that row equal to 1. If "i" is equal to zero, then this row is the only row in the encoding matrix. If "i" is equal to one, then add m rows $(x_1, x_2, \ldots x_m)$ corresponding to the vectors $x_1$, $x_2, \ldots x_m$ to the $\Re(i,m)$ matrix. Finally, if i is greater than 1, then we add an additional number of rows n corresponding to the "m-choose-i" function, such that $$n = \frac{m!}{i!(m-i)!}$$

Thus, a number of rows (n) are added corresponding to the number of ways of selecting i different objects from a set of (m) objects. An example of an RM code generator matrix $\Re(2,4)$ is provided below. For the matrix operations, addition is modulo-2 addition and multiplication steps are logical AND operations.

As discussed above, the first row of the generator matrix is comprised of vector of 1's.

$G_0 = [1111111111111111] = [a_0]$

The next four (m=4) rows are constructed from the binary representations of the integers from 0 to 15 (16 bits corresponding to $2^4$). The binary representations are arranged vertically in increasing order from left to right in the $G_1$ matrix below.

$$G_1 = \begin{bmatrix} 0 & 0 & 0 & 0 & 0 & 0 & 0 & 0 & 1 & 1 & 1 & 1 & 1 & 1 & 1 & 1 \\ 0 & 0 & 0 & 0 & 1 & 1 & 1 & 1 & 0 & 0 & 0 & 0 & 1 & 1 & 1 & 1 \\ 0 & 0 & 1 & 1 & 0 & 0 & 1 & 1 & 0 & 0 & 1 & 1 & 0 & 0 & 1 & 1 \\ 0 & 1 & 0 & 1 & 0 & 1 & 0 & 1 & 0 & 1 & 0 & 1 & 0 & 1 & 0 & 1 \end{bmatrix} = \begin{bmatrix} a_1 \\ a_2 \\ a_3 \\ a_4 \end{bmatrix}$$

Finally, the m-choose-i rows of the matrix are constructed from the $G_1$ matrix. The 4-choose-2 operation results in six possible permutations (therefore six rows). For a Reed-Muller (2,4) encoder (hereinafter referred to as an "RM(2, 4)" encoder or decoder), we first choose, for example, the first two rows from the $G_1$ matrix and perform a bit-wise logical AND operation to form the following matrix rows indicated by matrix $G_2$ below.

$$G_2 = \begin{bmatrix} 0 & 0 & 0 & 0 & 0 & 0 & 0 & 0 & 0 & 0 & 0 & 1 & 1 & 1 & 1 \\ 0 & 0 & 0 & 0 & 0 & 0 & 0 & 0 & 0 & 1 & 1 & 0 & 0 & 1 & 1 \\ 0 & 0 & 0 & 0 & 0 & 1 & 1 & 0 & 0 & 0 & 0 & 0 & 0 & 1 & 1 \\ 0 & 0 & 0 & 0 & 0 & 0 & 0 & 0 & 1 & 0 & 1 & 0 & 1 & 0 & 1 \\ 0 & 0 & 0 & 0 & 0 & 1 & 0 & 1 & 0 & 0 & 0 & 0 & 1 & 0 & 1 \\ 0 & 0 & 0 & 1 & 0 & 0 & 0 & 1 & 0 & 0 & 0 & 1 & 0 & 0 & 1 \end{bmatrix} = \begin{bmatrix} a_1 a_2 \\ a_1 a_3 \\ a_1 a_4 \\ a_2 a_3 \\ a_2 a_4 \\ a_3 a_4 \end{bmatrix}$$

There is no specific order of preference to ordering the rows of the generator matrix of G2. Moreover, this example is provided for illustration purposes only.

In general, the generator matrix G of RM (2,4) code will have k rows and n columns, where n is the code word length ($2^m$) and k is defined as follows.

$$k = \sum_{i=o}^{r} \binom{m}{i}$$

Thus, the Generator matrix G for the RM(2,4) code is an 11×16 matrix constructed from $G_0$, $G_1$, and $G_2$, which appears as follows.

$$\begin{bmatrix} 1 & 1 & 1 & 1 & 1 & 1 & 1 & 1 & 1 & 1 & 1 & 1 & 1 & 1 & 1 & 1 \\ 0 & 0 & 0 & 0 & 0 & 0 & 0 & 0 & 1 & 1 & 1 & 1 & 1 & 1 & 1 & 1 \\ 0 & 0 & 0 & 0 & 1 & 1 & 1 & 1 & 0 & 0 & 0 & 0 & 1 & 1 & 1 & 1 \\ 0 & 0 & 1 & 1 & 0 & 0 & 1 & 1 & 0 & 0 & 1 & 1 & 0 & 0 & 1 & 1 \\ 0 & 1 & 0 & 1 & 0 & 1 & 0 & 1 & 0 & 1 & 0 & 1 & 0 & 1 & 0 & 1 \\ 0 & 0 & 0 & 0 & 0 & 0 & 0 & 0 & 0 & 0 & 0 & 0 & 1 & 1 & 1 & 1 \\ 0 & 0 & 0 & 0 & 0 & 0 & 0 & 0 & 0 & 0 & 1 & 1 & 0 & 0 & 1 & 1 \\ 0 & 0 & 0 & 0 & 0 & 0 & 0 & 0 & 0 & 1 & 0 & 1 & 0 & 1 & 0 & 1 \\ 0 & 0 & 0 & 0 & 0 & 1 & 1 & 0 & 0 & 0 & 0 & 0 & 0 & 1 & 1 \\ 0 & 0 & 0 & 0 & 1 & 0 & 1 & 0 & 0 & 0 & 0 & 0 & 1 & 0 & 1 \\ 0 & 0 & 1 & 0 & 0 & 0 & 1 & 0 & 0 & 1 & 0 & 0 & 0 & 1 \end{bmatrix} = \begin{bmatrix} a_0 \\ a_1 \\ a_2 \\ a_3 \\ a_4 \\ a_1 a_2 \\ a_1 a_4 \\ a_1 a_4 \\ a_2 a_3 \\ a_2 a_4 \\ a_3 a_4 \end{bmatrix}$$

For example, using $\Re(2,4)$ to encode m=(01100000) gives 0*(1111111111111111)+1*(0000000011111111)+1*(0000111100001111)+0*(0011001100110011)+0*(0000000000001111)+0*(0000000000110011)+0*(0000000001010101)=(0000111111110000).

The rate (R) of the code can be found by dividing the number of rows by the number of columns (R=k/n). The minimum Hamming distance of the code can be shown to be $d_{min} = 2^{(m-r)}$. This minimum Hamming distance is much less than that of the Bose-Chaudhuri-Hochquenghem code (BCH code) with the codeword length n is large. The BCH code is a multilevel, cyclic, error-correcting, variable-length digital code used to correct errors up to approximately 25% of the total number of digits. It is important to note that BCH codes are not limited to binary codes, but may be used with multilevel phase-shifting keying whenever the number of levels is a prime number or a power of a prime number, such as 2, 3, 4, 5, 7, 8, 11, and 13. A BCH code in 11 levels has been used to represent the 10 decimal digits plus a sign digit. However, RM codes may not perform as well as the BCH codes if the RM codes are decoded using the conventional hard coding algorithm. Generally, decoding Reed-Muller encoded messages is more complex than encoding them. The theory behind decoding a Reed-Muller encoded message is based on the distance between vectors. The distance between any two vectors is the number of places in the two vectors that have different values. The distance between any two codewords in $\Re(i,m)$ is $2^{(m-i)}$. Reed-Muller coding is based on the assumption that the closest codeword in $\Re(i,m)$ to the received message is the original encoded message. For any error (e) to be corrected in the received message, the distance between any two received codewords must be greater than 2*(e). For the encoded message described above, the distance in $\Re(2,4)$ is $2^{(4-2)}$, or 4, which means that the code can fix 2e<4 (in other words, the decoder can fix errors within a distance of 1).

Generally, the decoding process for a $\Re(2,4)$ code is known to workers skilled in the art, and is too involved to explain in detail herein. However, it is important to understand that, within the above-mentioned limits, any errors in the received encoded codeword can be overcome during the decoding process via majority voting. For example, a message coded in $\Re(2,4)$ can be expressed as a collection of codeword bits (c) as follows with the corresponding codeword formed from:

C=MG where M=[M0M1M2] and where $$G = \begin{bmatrix} G_0 \\ G_1 \\ G_2 \end{bmatrix}.$$

Decoding of the message M begins in the Reed decoding algorithm by decoding $M_2$ and then proceeds to the decoding of $M_1$ and $M_0$ as is known by a worker skilled in the art.

For example, decoding of $M_2=\{m_5, \ldots m_{10}\}$ leads to the following expressions:

$c_0=m_0$ $c_1=m_0+m_4$ $c_2=m_0+m_3$ $c_3=m_0+m_3+m_4+m_{10}$ $c_4=m_0+m_2$ $c_5=m_0+m_2+m_4+m_{10}$ $c_6=m_0+m_2+m_3+m_8$ $c_7=m_0+m_2+m_3+m_4+m_8+m_9+m_{10}$ $c_8=m_0+m_1$ $c_9=m_0+m_1+m_4+m_7$ $c_{10}=m_0+m_1+m_3+m_6$ $c_{11}=m_0+m_1+m_3+m_4+m_6+m_7+m_{10}$ $c_{12}=m_0+m_1+m_2+m_5$ $c_{13}=m_0+m_1+m_2+m_4+m_5+m_7+m_9$ $c_{14}=m_0+m_1+m_2+m_3+m_5+m_6+m_8$ $c_{15}=m_0+m_1+m_2+m_3+m_4+m_5+m_6+m_7+m_8m_9+m_{10}+m_{11}+m_{12}+m_{13}+m_{14}+m_{15}$

These can be solved for $m_{10}$ to find the following equations.

$m_{10}=c_0+c_1+c_2+c_3$ $m_{10}=c_4+c_5+c_6+c_7$ $m_{10}=c_8+c_9+c_{10}+c_{11}$ $m_{10}=c_{12}+c_{13}+c_{14}+c_{15}$

If there are errors, the errors in the received codeword can be fixed through majority voting (if there are more 1's than 0's, then the bit is a 1). Generally, as described above, if the number of errors in the received code is less than 2 (i.e. 1 error or less), which is half of the $d_{min}$, then the encoded codeword can be correctly decoded.

The internal structure of the decoding system of the present invention is different from typical decoding schemes because high rate RM codes do not belong to the class of one-step majority decodable codes (such as LDPC codes). Therefore, RM codes do not support the conventional message-passing algorithm (MPA). Instead, the decoder of the present invention operates on a graph defined by the RM code.

By relaxing the orthogonality requirement, the code rate can be optimized to reach the code rate of LDPC codes, while maintaining a shorter code block length than is possible with LDPC codes. Thus, the high code rate can be achieved with shorter code blocks, thereby reducing or eliminating the large code-decoding delay characteristic of larger code blocks.

Generally, a code can contain a large number of codewords. Each codeword is a binary number made up of ones and zeros. The minimum distance of a code corresponds to the codeword that has the fewest number of ones (1's). For example, in a code containing hundreds of codewords, if a codeword, having the fewest ones as compared with all the codewords contained in the code, has only four (4) ones, then the minimum distance for that code is four. This minimum distance factor can be used to compare Reed-Muller codes with the LDPC codes.

As shown in FIG. 1, the codeword lengths of Reed-Muller codes are plotted against the code rates. The four plotted lines represent four different minimum distances. When the graph line showing a minimum distance of 32 (d=32) is compared with the graph line showing a minimum distance of 4 (d=4), the trade-off between codeword length and code rate becomes apparent. Specifically, assuming a codeword length of 10,000 bits, the code rate of the code having a minimum distance of 32 is approximately 0.88, while the corresponding code rate for code having a minimum distance of 4 is approximately 0.99.

Figure 2:
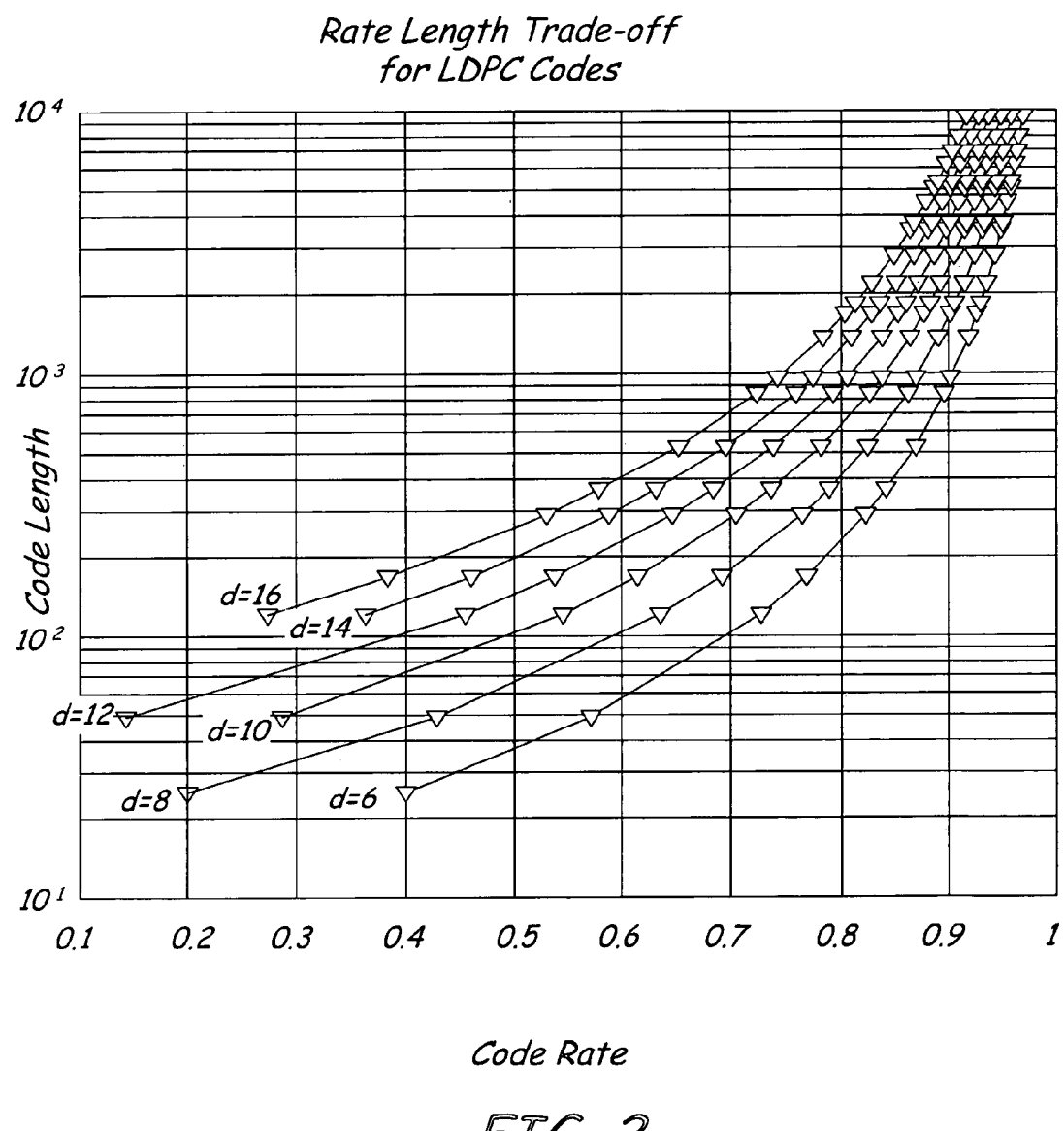
FIG. 2 is a graph of the codeword length versus code rate for deterministic LDPC codes.

In FIG. 2, the corresponding LDPC rate-length bounds are shown. Comparing FIGS. 1 and 2 using the same minimum distance and codeword lengths, RM codes can achieve higher code rates for a given length and minimum distance. For example, in FIG. 1, the code rate for a Reed-Muller code having a minimum distance of 8 at a codeword length of 1,000 bits is approximately 0.945. By contrast, in FIG. 2, the code rate for an LDPC code having a minimum distance of 8 and a codeword length of 1,000 bits is approximately 0.88. Thus, the Reed-Muller codes are shown to be capable of higher code rates for a given length and minimum distance than the LDPC codes.

Figure 3:
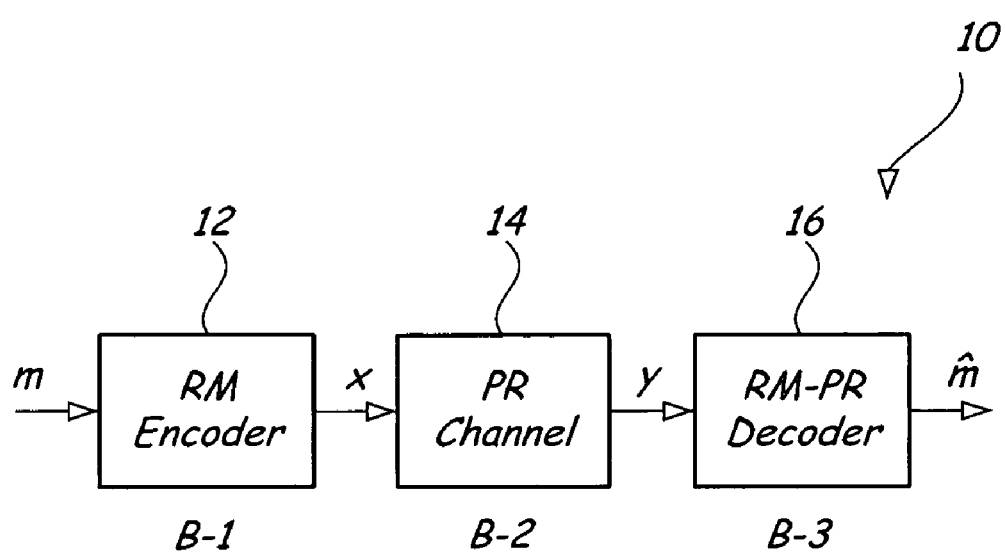
FIG. 3 is block diagram of a communication/recording system employing Reed-Muller coding.

FIG. 3 illustrates a communication system 10 according to the present inventiow The communication system 10 includes an RM-encoder 12, a partial-response channel 14, and a Reed-Muller error correcting, partial response channel decoder 16 (RM-PR 16). For simplicity, a transmission of a single codeword m is shown, though the same principle of operation holds for every message word transmitted. As shown, codeword m is input into the RM encoder 12, which generates an RM-encoded codewordx. RM-encoded codewordx is transmitted over the Partial-Response (PR) channel 14, which tends to introduce noise to the codewordx such that the received codewordy is input into the RM-PR decoder 16, which produces an output decoded estimated codeword.

The RM encoder 12 accepts a message word m of k-binary digits (bits) and converts the message word m into a codeword x comprised of n-bits. The codeword x is then transmitted through a communication channel 14 (such as an optical fiber, a wireless communication channel, or any other type of communication channel) or recording channel 14 (such as magnetic hard disc drive, and the like). The channel 14 is equalized to apartial-response target. In other words, at decoder 16, the impulse response of the channel 14 to a predefined transfer function is equalized to reduce the unwanted aspects of the channel response.

When the received codeword y arrives at the RM-PR decoder 16, the decoder 16 must attempt to optimally reconstruct the transmitted message word m. The decoder 16 ideally minimizes the number of bits where m and m̂ differ so as to minimize the number of bit errors.

Figure 4:
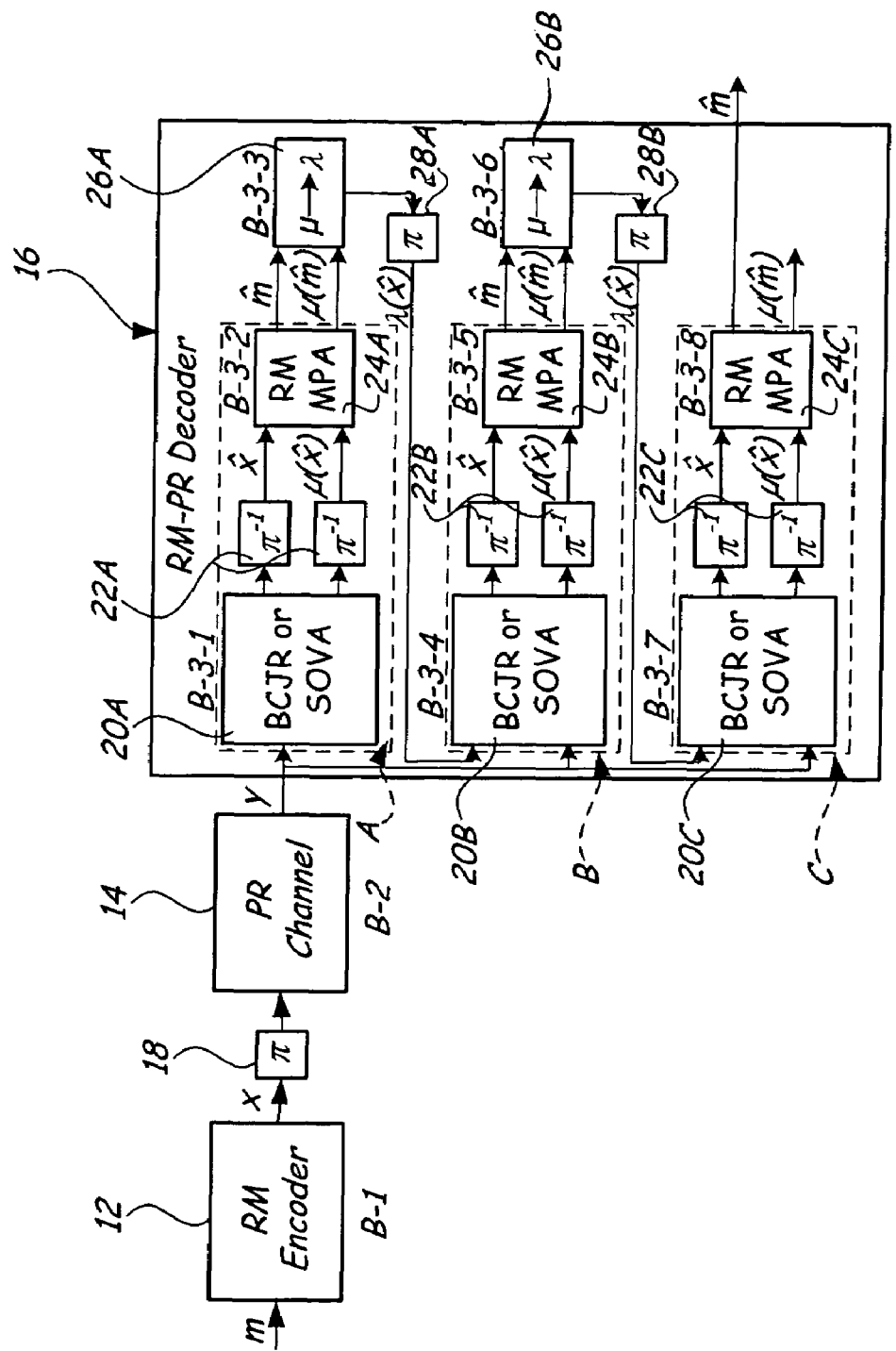
FIG. 4 is a block diagram of a Reed-Muller Partial-Response decoder according to the present invention.

FIG. 4 shows a modified version of the communication system 10 of FIG. 3 with an internal subsystems view of the RM-PR decoder 16. Specifically, FIG. 4 illustrates a communication system 10 including an RM encoder 12, a PR channel 14, a RM-PR decoder 16 and an interleaver 18 (denoted in FIG. 4 by the symbol $\pi$) disposed between the RM encoder 12 and the PR channel 14. The interleaver 18 orders reorders the RM-encoded codeword x prior to passing the codeword x to the partial-response channel 14. The interleaver 18 is shown here in the first portion of the communication circuit 10 in order to show a more complete system with respect to the corresponding elements in the RM-PR decoder 16 which is presented in an expanded form to show the decoder 16 in greater detail.

As shown, RM-PR decoder 16 has three stages A, B, and C. Stage A has a BCJR algorithm or SOVA algorithm based channel decoding device 20A, de-interleavers 22A (here shown as two de-interleavers denoted by $\pi^{-1}$ to show that the corresponding two preceding outputs are being "de-interleaved"), and a Reed-Muller message passing device 24A. Stages B and C have corresponding BCJR or SOVA algorithm based channel decoding devices 20B and 20C, corresponding de-interleavers 22B and 22C, and corresponding Reed-Muller message passing devices 24B and 24C. Between stages A and B is an assembler 26A and an interleaver 28A, and between stages B and C is a corresponding assembler 26B and an interleaver 28B. Assemblers 26A and 26B and interleavers 28A and 28B perform a transitional function that converts the soft-decision data received from the corresponding preceding Reed-Muller message passing device into the proper form for the next stage of the decoder 16, and such an assembler not necessary for the output of the final stage C of the decoder 16.

Generally, the RM-PR decoder 16 uses soft-output information from the BCJR or SOVA devices 20 to generate a code bit likelihood vector that can be used on the received information y to decode y into the message m̂, which should approximately match original message m. At stage A, the code bit likelihood vector is equal to zero because there is no reliability information about the received data. At each subsequent stage B and C, the reliability vector is improved from the processes performed at the previous stage so that in the last stage, an improved reliability vector $\lambda(\hat{x})$ is used to evaluate the received information y. Each RM-PR decoder 16 can have any number of stages, and the last stage of the decoder will not have an assembler 26 or an interleaver 28. Generally, the number of stages in the decoder 16 is determined by the system designer and constitutes a trade-off between the complexity and cost of the system as compared to the performance of the system. For the purpose of this description, a three-stage decoder 16 is shown.

As shown, the BCJR algorithm or the Soft-Output Viterbi algorithm is applied to the received codeword y by the BCJR or SOVA device 20A. The device 20A processes the received codeword y, producing code bit decisions on each bit of the codeword y as well as a code bit reliability vector $\lambda(\hat{x})$ for each code bit. The code bit decision and the code bit reliability vector are then passed through de-interleavers 22A (which are shown as two devices represented by $\pi^{-1}$ in order to demonstrate that the de-interleaving process is performed on both outputs of the BCJR or SOVA device 20A) to produce a de-interleaved code bit decision x̂ and a de-interleaved code bit reliability vector $\mu(\hat{x})$.

It should be noted that the de-interleavers 22A, 22B, and 22C are necessary in this instance because the RM-encoded signal x is passed through an interleaver 18 prior to transmission. If the RM encoded signal x were not processed by the interleaver 18, the de-interleavers 22A,22B,22C would not be necessary to the decoder 16.

Generally, the code bit decisions are represented in FIG. 4 as a vector x̂ of length n, while the corresponding code bit reliabilities $\mu(\hat{x})$ are represented as vectors of the same length n. These two vectors are inputs to the Reed-Muller Message Passing Algorithm block 24. For the detected vector and the corresponding reliability vector, the RM-MPA block 24 produces a decoded message bit m̂ and the corresponding reliability vector $\mu(\hat{m})$.

Though the decoding process could stop at this point, but for nearer to optimum performance, one or more additional stages of processing are chosen to be performed as described above. The decoded message bit m̂ and the associated reliability vector $\mu(\hat{m})$ contain the decoded message bits and the corresponding bit reliabilities, respectively, and not codeword reliabilities. The message bits and the corresponding bit reliabilities must be converted to codeword reliabilities to be used with incoming information at the next processing stage. Assembler converts the message bit reliabilities $\mu(\hat{m})$ into to improved codeword reliability vectors which are then passed through an interleaver 28A ($\pi$) to form $\lambda(\hat{x})$ that is provided to the next either BCJR or SOVA algorithm based channel decoding device 20B. The process is repeated n times (in this case, three times), and after n-stages, the last decoded message bits become the output of RM-PR decoder 24C.

As shown, the either BCJR or SOVA algorithm based channel decoding devices 20A, 20B, and 20C are identical. The BCJR or SOVA algorithm based channel decoding device 20A has no initial reliability vector $\lambda(\hat{m})$ associated with the received from the channel information codeword y, as indicated above, and so the second input of the BCJR or SOVA device 20A is a reliability vector $\lambda(\hat{x})$ of value zero, providing no indication of reliability. Subsequent BCJR or SOVA devices 20B and 20C have improved reliability vectors $\lambda(\hat{x})$ at each subsequent stage, such that the final stage of processing has a significantly improved reliability vector $\lambda(\hat{x})$ with which to process the code bits of the received codeword y. Thus, the accuracy of the RM-PR decoder 16 improves with each iteration.

Generally, the RM-MPA block 24 uses an RM code (r,m) that has the following parameters: length $n=2^m$, dimension $$k = \sum_{i=0}^{r} \binom{m}{j},$$

rate R=(n-k)/n, and minimum distance $2^{m-r}$, where the parameters r>0 and m<1 can be chosen arbitrarily. The notation $$\binom{m}{j}$$

is the combinatorial combination or "m-choose-j" function (the number of ways of selecting j different objects from a set of m different objects). The RM generator matrix can be generally written as $$G = \begin{bmatrix} G_0 \\ G_1 \\ \vdots \\ G_r \end{bmatrix}$$

wherein the submatrix $G_j$, $0 \leq j \leq r$, is of size $$\binom{m}{j} \times n.$$

For the decoding of the RM codes, there exists an algorithm called the Reed algorithm as indicated above, which is a maximum likelihood decoding algorithm when only code bit hard decisions are available. In the present invention, the code bit reliabilities are utilized in making bit decisions instead of just making code bit hard decisions.

Generally, in the Reed algorithm, the decoding is performed in r steps. In step j, the message word $x^{(j)}$ of length $\binom{m}{j}$, corresponding to $G_j$ (with) message word bits $x_s^{(j)}$ having index s such that $$\sum_{i=0}^{j-1}\binom{m}{i} + 1 \leq s \leq \sum_{i=0}^{j}\binom{m}{i}$$

is detected. For each of these bits, a set of $2^{m-j}$ linear equations can be written, involving all n bits of the received code word y. The positions of the code bits involved in the equations for calculating the s-th message bit, $x_s^{(j)}$, are given by the corresponding one of arrays $P_s$ that are based on the check sum equation and bit solution orthogonal to each bit $x_s^{(j)}$.

In each array $P_s$, each column shows the locations of the code bits to be added together to give an estimation of the message bit $x_s$. This addition is modulo-2 addition. In the hard-coding version, the message bit is determined by a majority vote among all $2^{m-j}$ estimations, (as described above), and the received code vector is updated according to the relation $y \leftarrow y \times x^{(j)} G_j$, and then passed to the next decoding step (step j×1).

In the present invention, the method uses the log-bit likeihood ratios (LLR) to indicate the bit reliabilities as $$LLR(b_s) = \log\left(\frac{\text{Probability}(b_s = +1 \mid y)}{\text{Probability}(b_s = -1 \mid y)}\right)$$

where $b_s$ is the channel input and where y is the channel output. The log-bit likelihood of the s-th message bit from the l-th equation on the j-th step is calculated as follows, assuming all code bits are independent, as $$\mu(\hat{m}_s^{i,j}) = -S_s^{i,j} \cdot \log\left\{-\tanh\left(\frac{A_s^{i,j}}{2}\right)\right\}, \quad (1)$$

$$S_s^{i,j} = \prod_l \text{sign}\{\mu(\hat{x}_l^{i,j,s})\} \quad (2)$$

where $$\mu\left(\hat{x}_l^{i,j,k}\right)$$

is the LLR of the expression for the s-th message bit from the i-th equation in the j-th level, and where $$A_s^{i,j} = \sum_l \log\left|\tanh\left(\frac{\mu(\hat{x}_l^{i,j,s})}{2}\right)\right|. \quad (3)$$

and

The product and summation operations in equations (2) and (3) above are performed on the bit likelihoods of the code bits whose locations in the received codeword are determined by the l-th column of the matrix $P_s$. For the reduced complexity, (1), (2), and (3) may be approximated as $$\mu(\hat{m}_s^{i,j}) = \left[\prod_l \text{sign}\{\mu(\hat{x}_l^{i,j,s})\}\right] \cdot \min_l\{|\mu(\hat{x}_l^{i,j,s})|\}. \quad (4)$$

The product and minimization operations in equation (4) are performed on the same bit likelihoods as in equations (2) and(3). Next, the updated LLR of the k-the message bit in the j-th level is calculated by combining the likelihoods obtained from all $2^{m-j}$ equations. In other words $$\mu(\hat{m}_s) = \sum_{1 \leq l \leq 2^{m-j}} \mu(\hat{m}_s^{i,j}). \quad (5)$$

In the hard decoding version (Reed algorithm), a message bit is determined by a majority vote, and the received code vector is updated using the expression $y \leftarrow y \times x^{(j)} G_j$ given above, and then passed to the next decoding step. In the soft decoding version, prior to advancing to the next row of the decoder 16, the updated message bit likelihoods must be converted to the code bit likelihoods. This conversion is performed based on the submatrix $G_j$.

Figure 5:
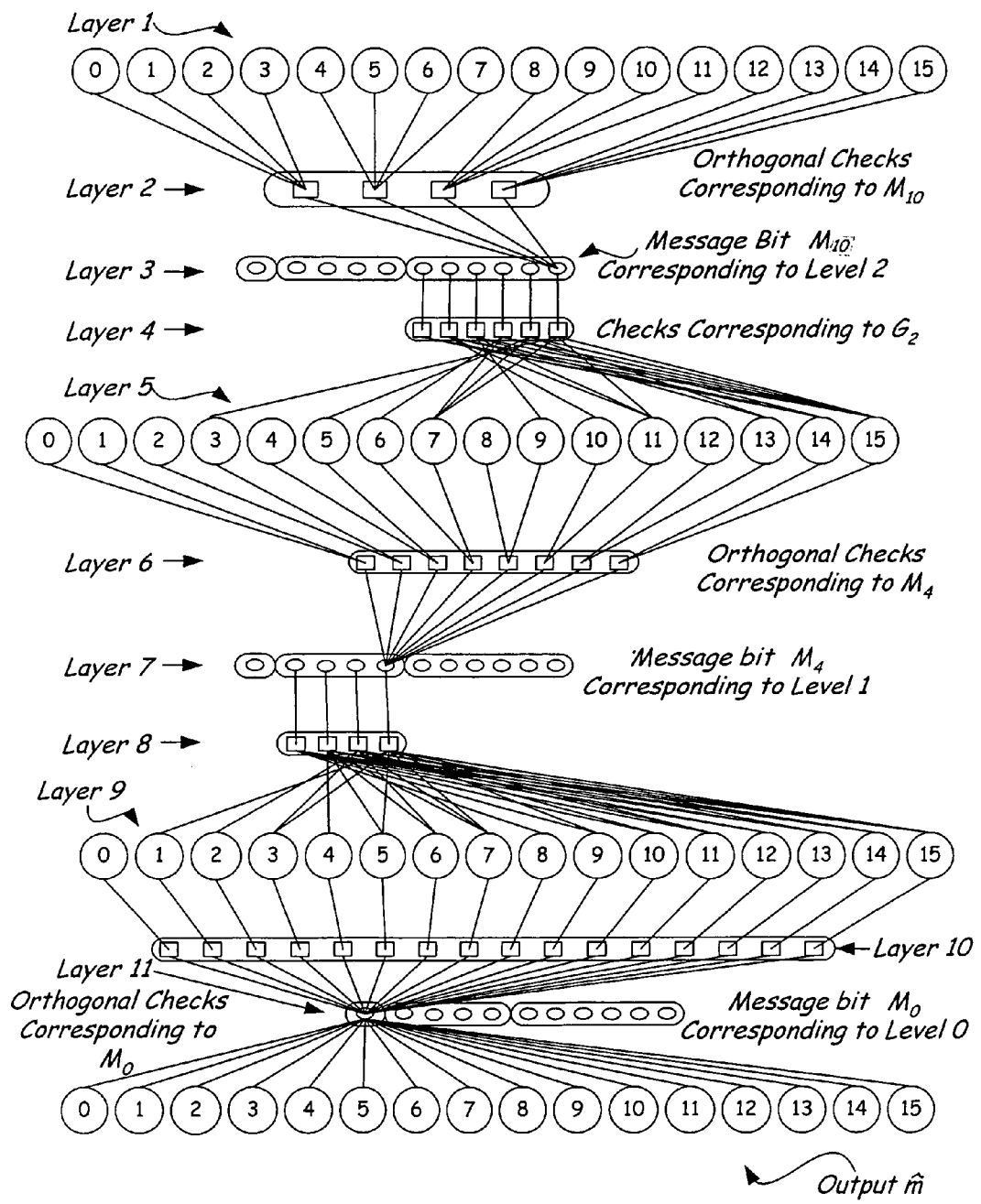
FIG. 5 illustrates data flow in a soft (2,4) Reed-Muller decoder.

FIG. 5 illustrates an eleven layer representation of a "Reed graph" designed to place the mathematical formulae of the instant invention into a graphical perspective though just shown for the code bits and messages bits formulae with a similar graph being used for the reliabilities formulae with corresponding indices. In this example, layer 1 represents a sixteen bit codeword received from the channel 14. In alternative situations, the codeword could be much larger than 16 bits.

In essence layer 1 represents the coded bits y received from the channel 16. The equations given above for message bit $m_{10}$, are chosen as an example, and are determined at layer 2 in FIG. 5 for reduced complexity.

Then, a soft-averaging, or rather an averaging of the LLRs is performed at layer 3. Then, we use submatrix $G_2$ (below) to update code bit likelihoods using equations (6), (7), and (8), or (9) below.

The positions of ones in the i-th column of $G_j$ (below) indicate what message bits on the j-th level are used to calculate the i-th code bit in accordance with the codeword generation matrix equation. For example, the nonzero elements in the 15-th column of $G_2$ below are 1,2, and 3. This means that on the second level, the message bits $m_6$ (=1+5), $m_7$ (=2+5) and $m_8$ (=3+5) are used to calculate the 15-th code bit. On the second level of encoding in this example, only the message bits from the location 6 to 11 are used again in accord with the codeword generator matrix equation. In a similar fashion we can find which message bits are used to compute i-th bit on the j-th level.

Suppose that the nonzero positions of the l-th column of $G_j$ are given by the set $\{l_1 \ldots l\}$ where $$l_1 \geq \sum_{i=0}^{j-1} \binom{m}{i} \quad \text{and} \quad l_t \leq \sum_{i=0}^{j} \binom{m}{i}$$

Then the conversion from message bit LLR to code bit LLR ($\mu \to \lambda$) is provided as $$\lambda(\hat{x}_l) = -S_l \cdot \log\left\{-\tanh\left(\frac{A_l}{2}\right)\right\} \quad (6)$$

where $$S_l = \prod_j \text{sign}\{\mu(\hat{m}_{l_j})\} \quad (7)$$

and $$A_l = \sum_j \log\left|\tanh\left(\frac{\mu(\hat{m}_{l_j})}{2}\right)\right|. \quad (8)$$

The equations (6), (7), and (8) may also be approximated as follows.

$$\lambda(\hat{x}_l) = \left[\prod_j \text{sign}\{\mu(\hat{m}_{l_j})\}\right] \cdot \min_j\{|\mu(m_{l_j})|\} \quad (9)$$

This processing is performed layer 4 in the Reed graph of FIG. 5.

The updated LLR's for all of the code bits, which are to be used in the next decoding step, are found by applying equations (1),(2), and (3), or (4) above to the output of equations (6) or (9)as the output of the previous decoding level (j-1), which is the same as the input to the current decoding level (j). The final processing for each of the first two stages of RM-PR decoder 16 is provided by the corresponding one of assemblers 26A and 26B for each stage respectively. This assembler function is performed by again applying equations (6), (7) and (8) or (9) to the LLR sequence of reliabilities of decoded message bits $\mu(\hat{m})$, and this time the entire generator matrix G is used. The above equations (1-9) and subsequent updates to the code bit log likelihood reliabilities can be viewed as providing a message passing algorithm on the Reed graph indicated above.

Then the process is repeated using the soft-decoded reliability vector derived from equations 6 or 9 above beginning with layer 6 in the Reed graph of FIG. 5, which uses the original 16 bits and the reliability vector.

Within the Reed graph, the connections between observation variables and hidden variables are different from those in factor graphs introduced with respect to one-step majority decodable code graphs in the prior art. The schedule of passing messages in the present invention is defined by the geometric structure of the Reed-Muller codes.

To illustrate the idea, we use the following example. Consider the (r,m)=(2,4) RMcode. The corresponding generator sub-matrices are repeated below from above as $$G_0 = [\,1\ 1\ 1\ 1\ 1\ 1\ 1\ 1\ 1\ 1\ 1\ 1\ 1\ 1\ 1\ 1\,],$$

$$G_1 = \begin{bmatrix} 0 & 0 & 0 & 0 & 0 & 0 & 0 & 0 & 1 & 1 & 1 & 1 & 1 & 1 & 1 & 1 \\ 0 & 0 & 0 & 0 & 1 & 1 & 1 & 1 & 0 & 0 & 0 & 0 & 1 & 1 & 1 & 1 \\ 0 & 0 & 1 & 1 & 0 & 0 & 1 & 1 & 0 & 0 & 1 & 1 & 0 & 0 & 1 & 1 \\ 0 & 1 & 0 & 1 & 0 & 1 & 0 & 1 & 0 & 1 & 0 & 1 & 0 & 1 & 0 & 1 \end{bmatrix},$$

$$G_2 = \begin{bmatrix} 0 & 0 & 0 & 0 & 0 & 0 & 0 & 0 & 0 & 0 & 0 & 0 & 1 & 1 & 1 & 1 \\ 0 & 0 & 0 & 0 & 0 & 0 & 0 & 0 & 0 & 1 & 1 & 0 & 0 & 1 & 1 \\ 0 & 0 & 0 & 0 & 0 & 1 & 1 & 0 & 0 & 0 & 0 & 0 & 1 & 1 \\ 0 & 0 & 0 & 0 & 0 & 0 & 0 & 0 & 1 & 0 & 1 & 0 & 1 & 0 & 1 \\ 0 & 0 & 0 & 0 & 1 & 0 & 1 & 0 & 0 & 0 & 0 & 0 & 1 & 0 & 1 \\ 0 & 0 & 0 & 1 & 0 & 0 & 0 & 1 & 0 & 0 & 0 & 1 & 0 & 0 & 0 & 1 \end{bmatrix}.$$

The four equations for the message bit $m_{10}$ given above are repeated here:

$$m_{10} = c_0 + c_1 + c_{2+c3} \quad (10)$$

$$m_{10} = c_4 + c_5 + c_{6+c7} \quad (11)$$

$$m_{10} = c_8 + c_9 + c_{10+c11} \quad (12)$$

$$m_{10} = c_{12} + c_{13} + c_{14+c15} \quad (13)$$

A corresponding array of the orthogonal parity checks for the message bit $m_{10}$ is shown below ($P_5 = P_{10}$):

$$P_{10} = \begin{bmatrix} 0 & 4 & 8 & 12 \\ 1 & 5 & 9 & 13 \\ 2 & 6 & 10 & 14 \\ 3 & 7 & 11 & 15 \end{bmatrix}$$

Similarly, as indicated above, for the other message bits ($\hat{m}_i$,) the corresponding ones of arrays $P_s$ involving the related checksum equations and bit solutions orthogonal thereto are $$P_9 = \begin{bmatrix} 0 & 2 & 8 & 10 \\ 1 & 3 & 9 & 11 \\ 4 & 6 & 12 & 14 \\ 5 & 7 & 13 & 15 \end{bmatrix} \quad P_8 = \begin{bmatrix} 0 & 1 & 8 & 9 \\ 2 & 3 & 10 & 11 \\ 4 & 5 & 12 & 13 \\ 6 & 7 & 14 & 15 \end{bmatrix}$$

$$P_5 = \begin{bmatrix} 0 & 4 & 8 & 12 \\ 1 & 5 & 9 & 12 \\ 2 & 6 & 10 & 14 \\ 3 & 7 & 11 & 15 \end{bmatrix} \quad P_6 = \begin{bmatrix} 0 & 1 & 4 & 5 \\ 2 & 3 & 6 & 7 \\ 8 & 9 & 12 & 13 \\ 10 & 11 & 14 & 15 \end{bmatrix} \quad P_7 = \begin{bmatrix} 0 & 2 & 4 & 6 \\ 1 & 3 & 5 & 7 \\ 8 & 10 & 12 & 14 \\ 9 & 11 & 13 & 15 \end{bmatrix}$$

$$P_4 = \begin{bmatrix} 0 & 2 & 4 & 6 & 8 & 10 & 12 & 14 \\ 1 & 3 & 5 & 7 & 9 & 11 & 13 & 15 \end{bmatrix}$$

$$P_3 = \begin{bmatrix} 0 & 1 & 4 & 5 & 8 & 9 & 12 & 13 \\ 2 & 3 & 6 & 7 & 10 & 11 & 14 & 15 \end{bmatrix}$$

$$P_2 = \begin{bmatrix} 0 & 1 & 2 & 3 & 8 & 9 & 10 & 11 \\ 4 & 5 & 6 & 7 & 2 & 3 & 4 & 5 \end{bmatrix}$$

$$P_1 = \begin{bmatrix} 0 & 1 & 2 & 3 & 4 & 5 & 6 & 7 \\ 8 & 9 & 10 & 11 & 12 & 13 & 14 & 15 \end{bmatrix}$$

The Reed graph of FIG. 5, as indicated above, is based on the above parity check arrays and illustrates the determination of selected ones of the message bits. The bipartite graph in the top portion of the figure corresponds to the orthogonal parity checks (squares) involving the second level message bits and code bits (j=2). The connections involving the four parity checks in the top portion are defined by the corresponding checksum equation and bit solution for message bit $m_{10}$ as reflected in the array $P_{10}$. All other connections for the second level message bits $m_5, m_6, \ldots, m_9$ can be found in the corresponding arrays $P_5, P_6, \ldots, P_9$.

In the first step of decoding, the code bit LLR's (layer 1) are passed through the check nodes (layer 2) to the message variables (layer 3), using equations (1), (2), and (3) or equation (4), and the equation (5), from above. After computing all the message bit likelihoods on the second level, submatrix G2 is used to update the code bit likelihoods using equations (6), (7), and (8) or equation (9) above. The first iteration step is finished when all message bits and all message bit likelihoods are obtained and all code bit likelihoods are updated. Then, decoding proceeds to the next iteration.

As shown in FIGS. 6 through 15, the performance of the above-described decoding technique was tested using two different ideal PR channels with additive white Gaussian noise (AWGN), a PR2 channel having an impulse response of {1 2 1} and an EPR4 channel having an impulse response of {1 1 −1 −1}. An ideal PR channel is a channel that has an impulse response that is exactly known without using an equalizer. In the figures, an ideal EPR4ML or ideal PR2ML refers to the application of a maximum likelihood sequence detection (Viterbi algorithm) to the specified uncoded ideal channel (EPR3 or PR2).

The system was tested using three different groups of RM codes according to their minimum distances ($d_{min}$) as shown in Table 1.

TABLE 1

RM CODES USED FOR TESTING

| $d_{min}$ | Code |
|---|---|
| 16 | RM(5,9); RM(4,8); and RM(3,7) |
| 8 | RM(6,9); RM(5,8); RM(4,7); and RM(3,6) |
| 4 | RM(4,6) and RM 5,7) |

Each of the codes in Table 1 has a code rate as shown in Table 2.

TABLE 2

CODE RATES FOR RM CODES USED FOR TESTING.

| Code | Code Rate (R) |
|---|---|
| RM (5,9) | 0.746 |
| RM(4,8) | 0.637 |
| RM(3,7) | 0.5 |
| RM(6,9) | 0.910 |
| RM(5,8) | 0.855 |
| RM(4,7) | 0.773 |
| RM(3,6) | 0.656 |
| RM(4,6) | 0.891 |
| RM(5,7) | 0.938 |

As shown in FIGS. 6-15, the soft-iterative decoding system of the present invention was used to decode the RM codes of Table 1 using 10 iterations in each instance. In other words, the decoder 16 used for the test included 10 rows of devices (20A,22A,24A,26A,28A or B-3-1,B-3-2,B-3-3 as shown in FIG. 4). In each instance, the coded sector size was 4096 bits, and many codewords were used to fill one complete sector. Of course, the number of codewords varied according to the RM code used.

Generally, all transmissions (both inter-device and intra-device) are concerned with the signal-to-noise ration (SNR). The SNR and the noise variance are related by the following equation:

$$SNR = 10\log_{10}\left\{\frac{Es}{2\sigma^2 \cdot R}\right\}$$

where $E_s$ is the average channel bit energy, $\sigma^2$ is the variance of the noise channel, and R is the code rate.

Regardless of the channel, hard Reed-Muller decoding shows very poor Bit Error Rates (BER) relative to the soft-decoding technique of the present invention, especially with RM(6,9), RM(5,7), and RM(4,6) cases, where the code rates are relatively high. This result was expected because RM codes are known to perform well at low code rates. In general, it appears that code rates above 0.9 do not perform efficiently for RM decoding, for hard-decision or soft-decision implementations. Additionally, both soft-decoding and hard-decoding techniques perform less than ideally in a low SNR region, a performance characteristic which appears to stem from error propagation within the decoding steps. In other words, from the internal structure of the multi-step decoding process of RM-codes, when an early decoding step results in an erroneous (hard or soft) decision, the error tends to propagate to the following steps.

Figure 6:
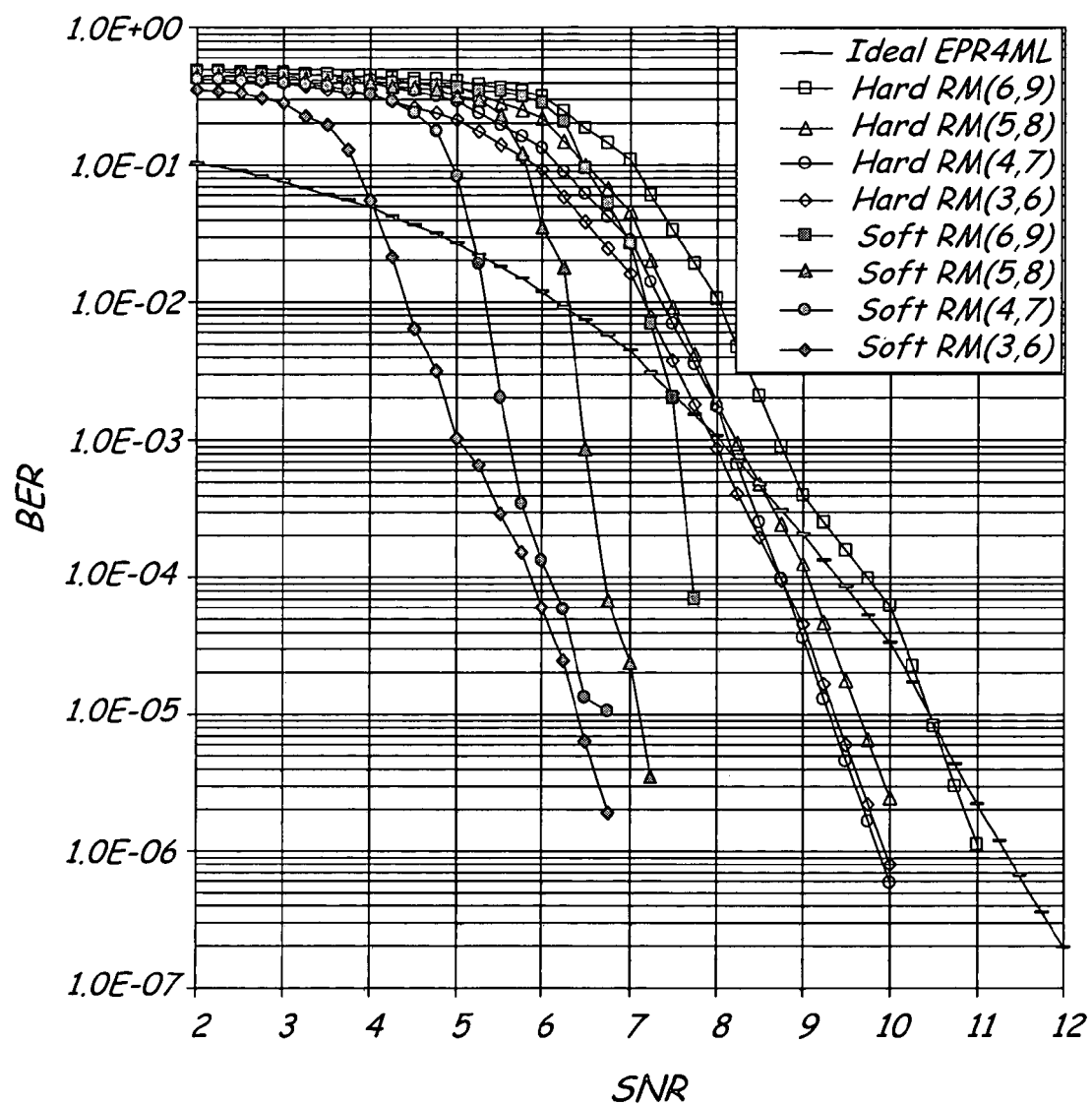
FIG. 6 is a graph of the bit-error rate versus the signal to noise ratio of Reed-Muller codes with $d_{min}=8$ and an ideal EPR4ML channel having an impulse response of $\{+1 +1 -1 -1\}$.

As shown in FIG. 6, as the codeword length (i) decreases, the total number of codewords in a sector increases. Correspondingly, as the codeword length decreases, the cross-over point (the point where the graph of the RM BER vs. SNR graph crosses the graph of the ideal EPR4ML channel) moves toward the low SNR region. In other words, the performance of the shorter codewords is noticeably better than the longer codewords; however, the soft-decoding system of the present invention outperforms the hard RM decoding technique by an average of 3 dB for RM codes with $d_{min}$–8 and an ideal EPR4 channel with an impulse response of $\{1\ 1\ -1\ -1\}$.

The improvement comes from the fact that within the system of the present invention error propagation is confined within one codeword. If there are many codewords in a given sector, error propagation from one erroneous codeword does not effect neighboring codewords. By contrast, if there is only one codeword in a sector, the error propagation effects all the bits in a the sector. As the SNR increases, the result of the limiting error propagation decreases, since there are fewer errors in any given sector. At the BER of 10-5 (1 error in 100,000 bits), the soft-iterative decoding system shows an overall coding gain of 4.0 dB over the un-coded system and a coding gain of about 3.0 dB over the hard-decoded system.

Figure 7:
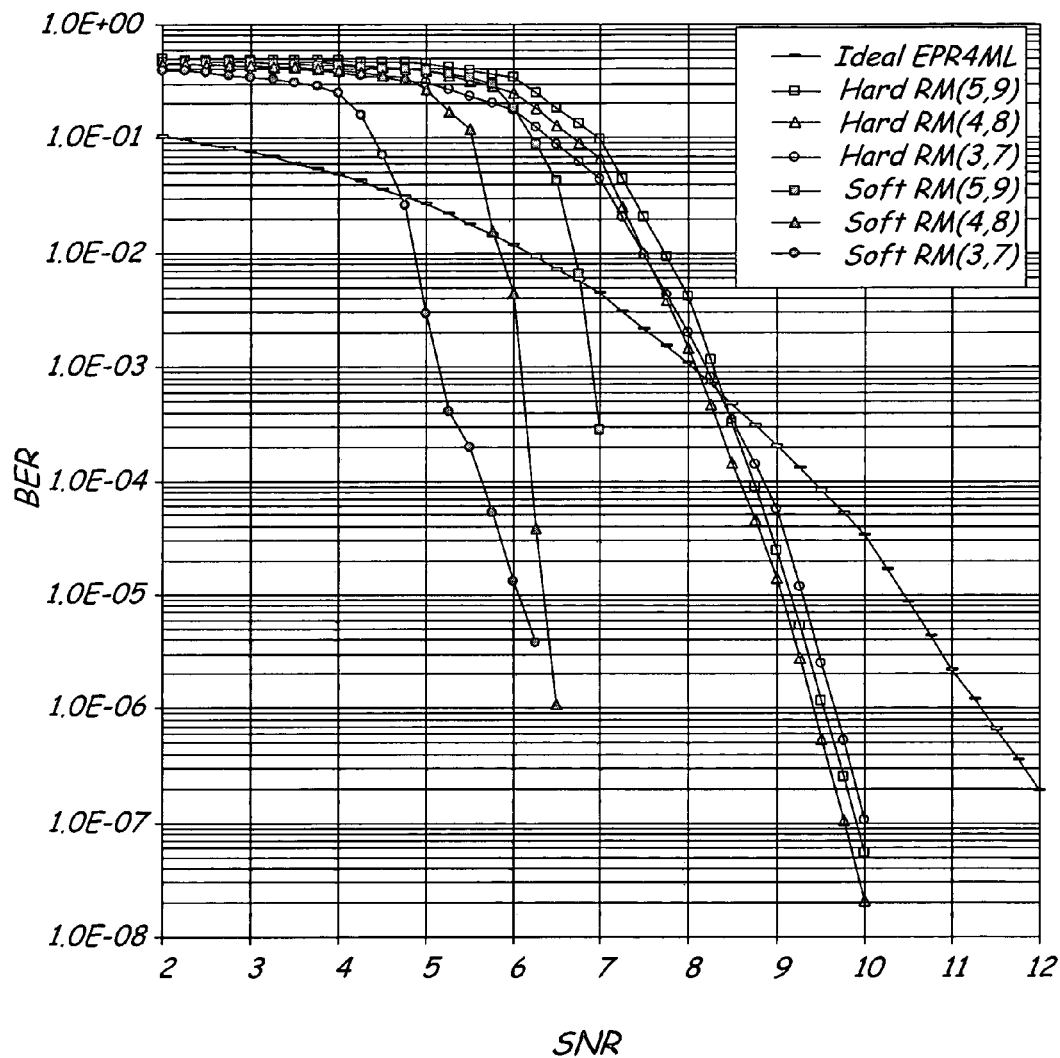
FIG. 7 is a graph of the bit-error rate versus the signal to noise ratio of Reed-Muller codes with $d_{min}=16$ and an ideal EPR4ML channel having an impulse response of $\{+1 +1 -1 -1\}$.

FIG. 7 illustrates the same trends a FIG. 6, though the gains of the soft-iterative decoding system are larger. The graph of FIG. 7 illustrates larger $d_{min}$ and lower code rates than in FIG. 6. The slope of the BER curves in the "waterfall region" (the region where the graph line approaches vertical) are steeper than those of FIG. 6. Finally, the BER of the RM hard-coded techniques also showed an improvement, though the soft-iterative decoding system shows a little over a 3 dB code gain over the hard-coded system and a 4 dB code gain over the un-coded system.

Figure 8:
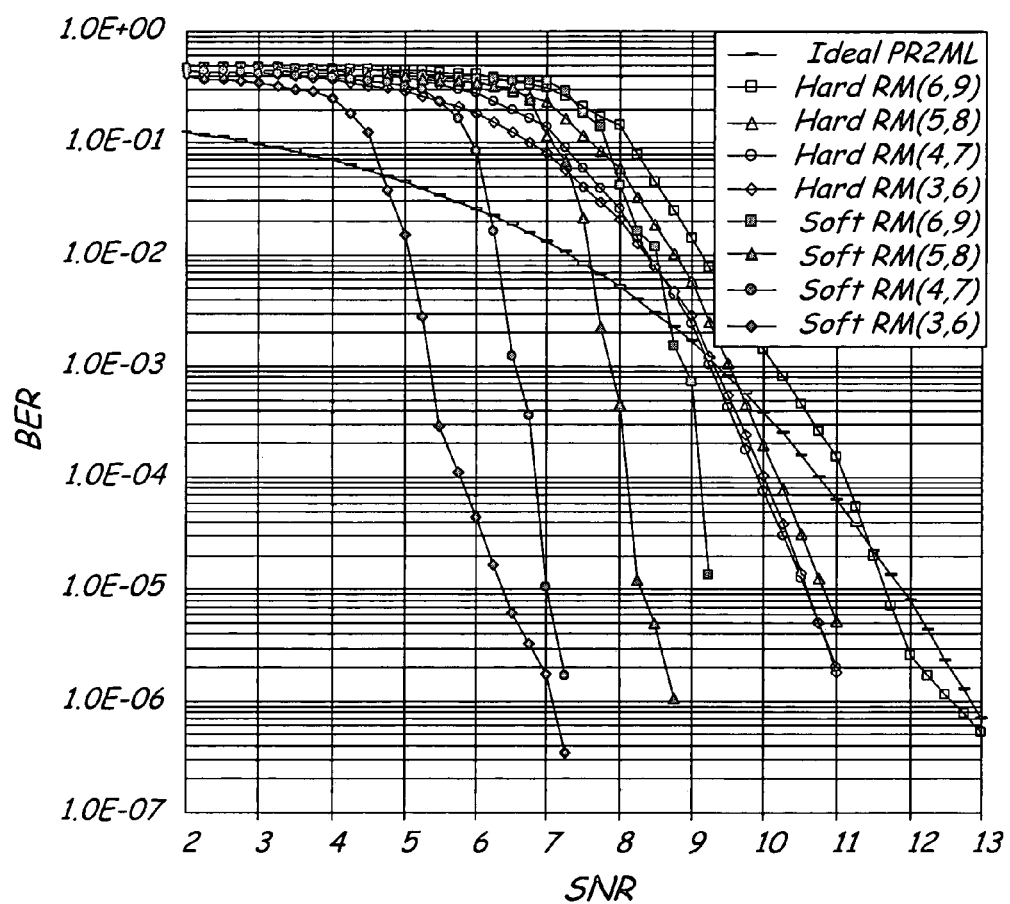
FIG. 8 is a graph of the bit-error rate versus the signal to noise ratio of Reed-Muller codes with $d_{min}=8$ and an ideal PR2ML channel with an impulse response of $\{1\ 2\ 1\}$.
Figure 9:
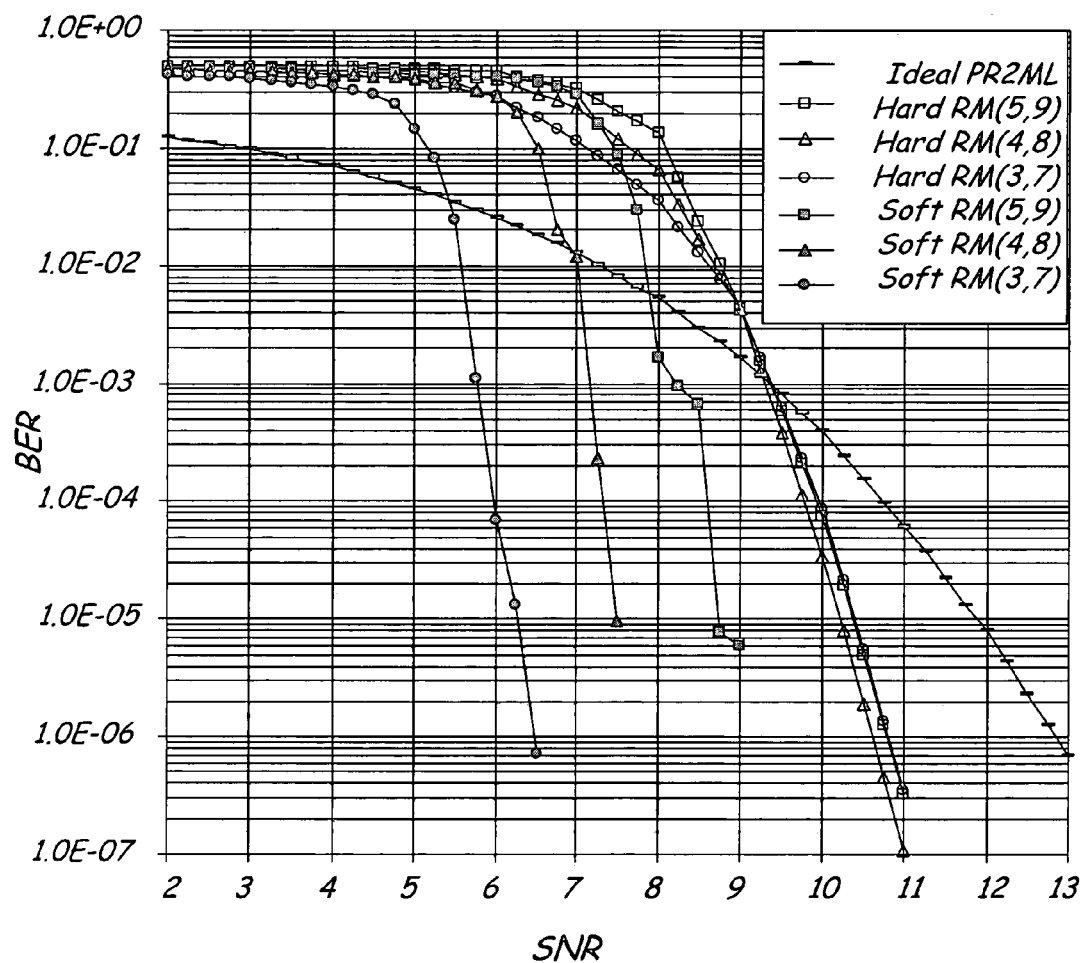
FIG. 9 is a graph of the bit-error rate versus the signal to noise ratio of Reed-Muller codes with $d_{min}=16$ and an ideal PR2ML channel having an impulse response of $\{1\ 2\ 1\}$.

FIGS. 8 and 9 show similar trends for the PR2 channel having an impulse response of $\{1\ 2\ 1\}$. Specifically, FIG. 8 illustrates almost a 5.5 dB code gain for soft RM(3,6) relative to the un-coded system, and more than 4 dB code gain relative to the hard RM(3,6) at a BER of 1 in 100,000. In this instance, the $d_{min}$ equaled 8.

In FIG. 9, the RM codes had a $d_{min}$ of 16. The soft RM(3,7) decoding technique showed a 5.8 dB gain over the un-coded system, and more than a 4 dB over the corresponding hard RM(3,7) system.

Figure 10:
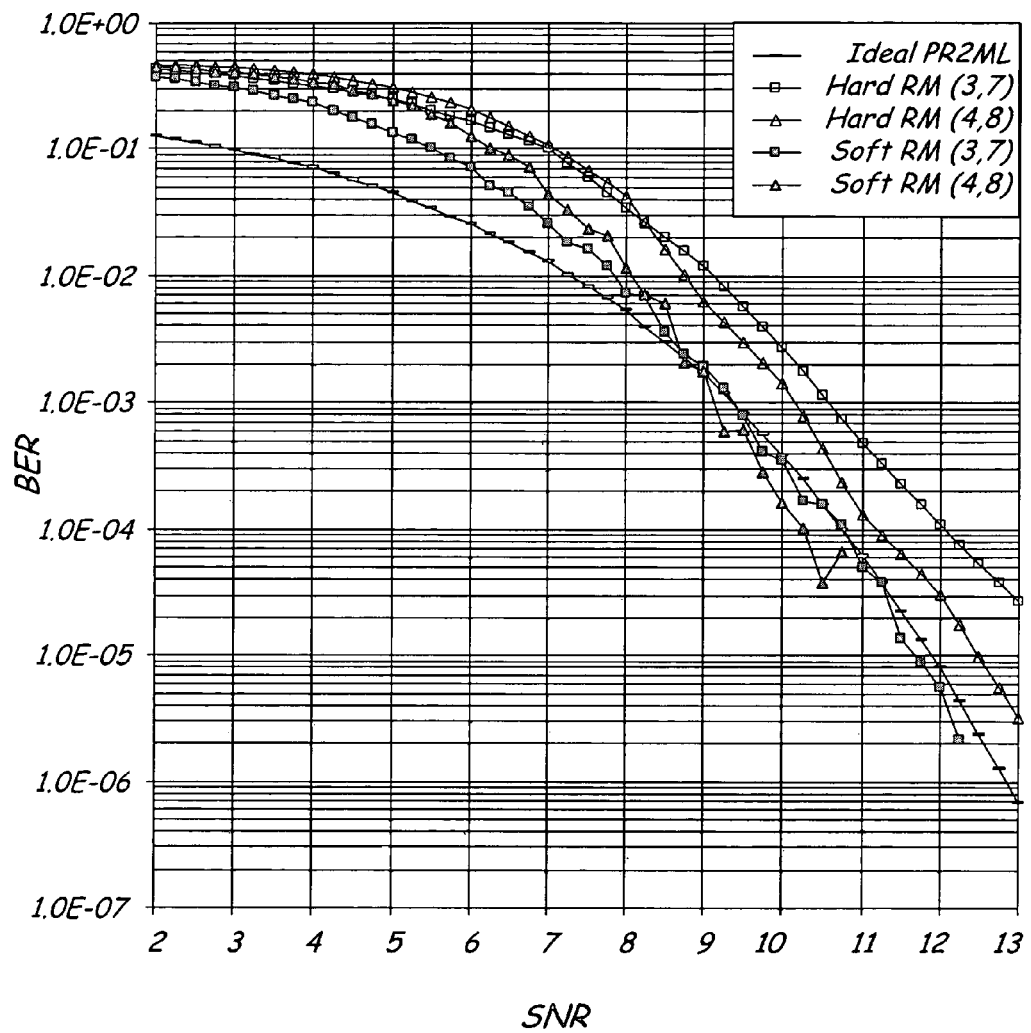
FIG. 10 is a graph of the bit-error rate versus the signal to noise ratio of Reed-Muller codes with no interleaver and an ideal PR2 channel.

FIG. 10 illustrates the role of the interleaver ($\pi$). Specifically, the interleaver distributes longer error events over the entire sector. Additionally, the interleaver appears to make burst errors into random erros. This effect appears to be important to the performance of the RM decoders.

Figure 11:
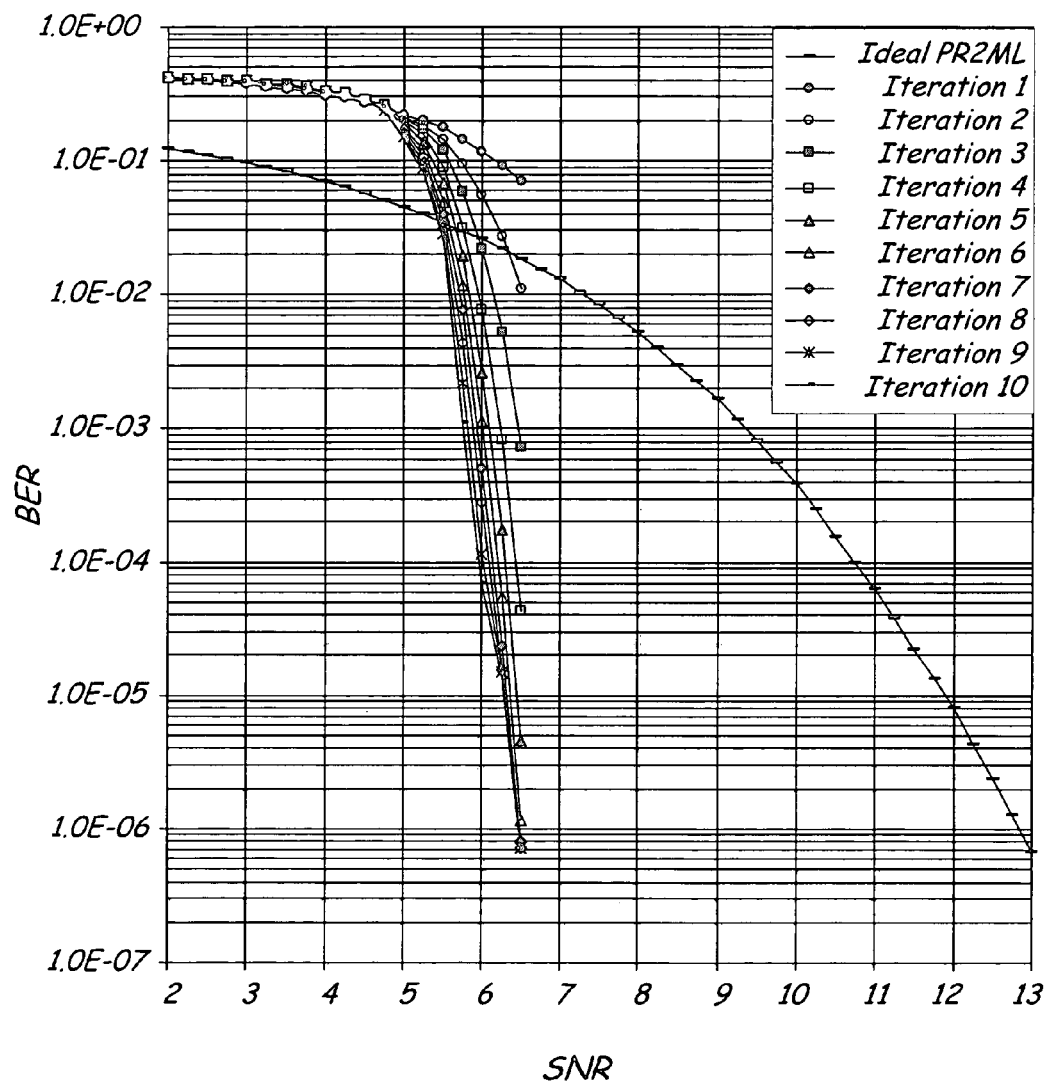
FIG. 11 is a graph of the bit-error rate versus the signal to noise ratio of a Reed-Muller (3,7) code and an ideal partial-response (2) channel for 10 iterations from 1 to 10.

FIG. 11 shows the BERs at each iteration of the soft-iterative decoding for RM(3,7) code. Each iteration represents one row in FIG. 4 (as described above—including devices 20, 22, 242 26, and 28). The first four or five iterations appear to achieve the most significant gains.

Figure 12:
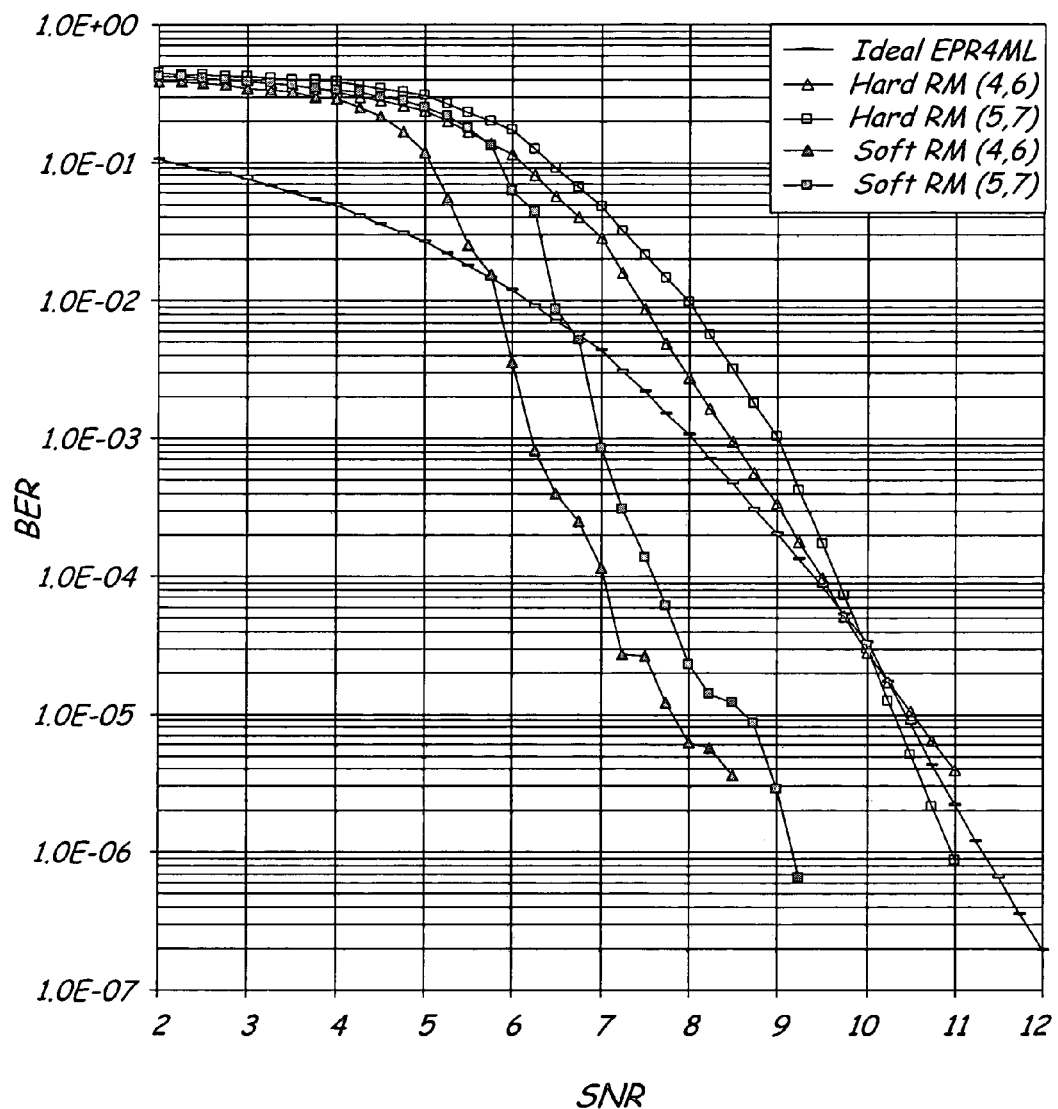
FIG. 12 is a graph of the bit-error rate versus the signal to noise ratio of high rate Reed-Muller codes with $d_{min}=4$ and an ideal EPR4 channel.
Figure 13:
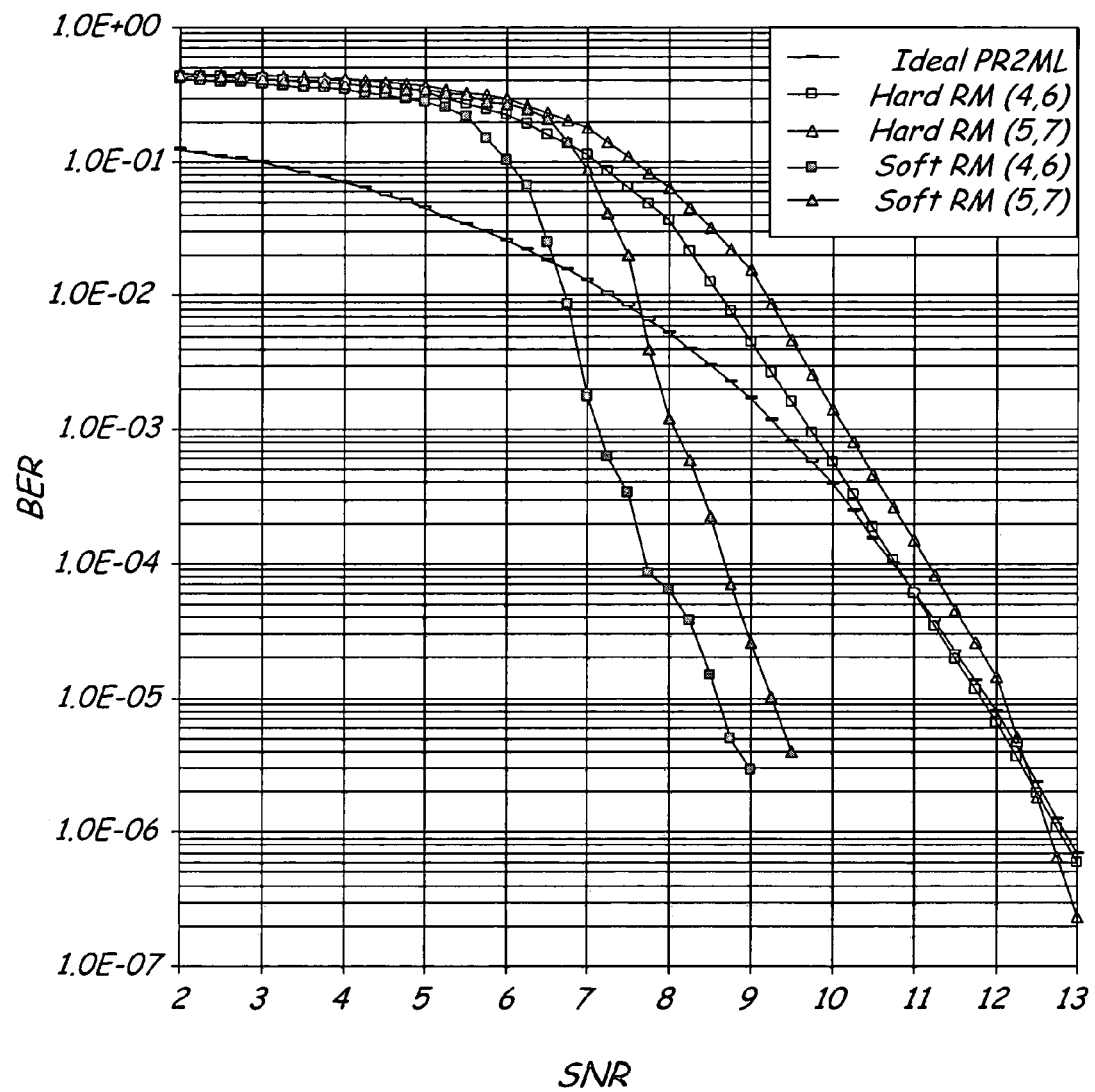
FIG. 13 is a graph of the bit-error rate versus the signal to noise ratio of high rate Reed-Muller codes with $d_{min}=4$ and an ideal PR2 channel.

FIGS. 12 and 13 illustrate testing of high rate codes, confirming that the RM codes do not perform as well if the code rates are high. Even in this instance, the soft RM(4,6) and soft RM(5,7) decoder outperforms the hard RM system.

Figure 14:
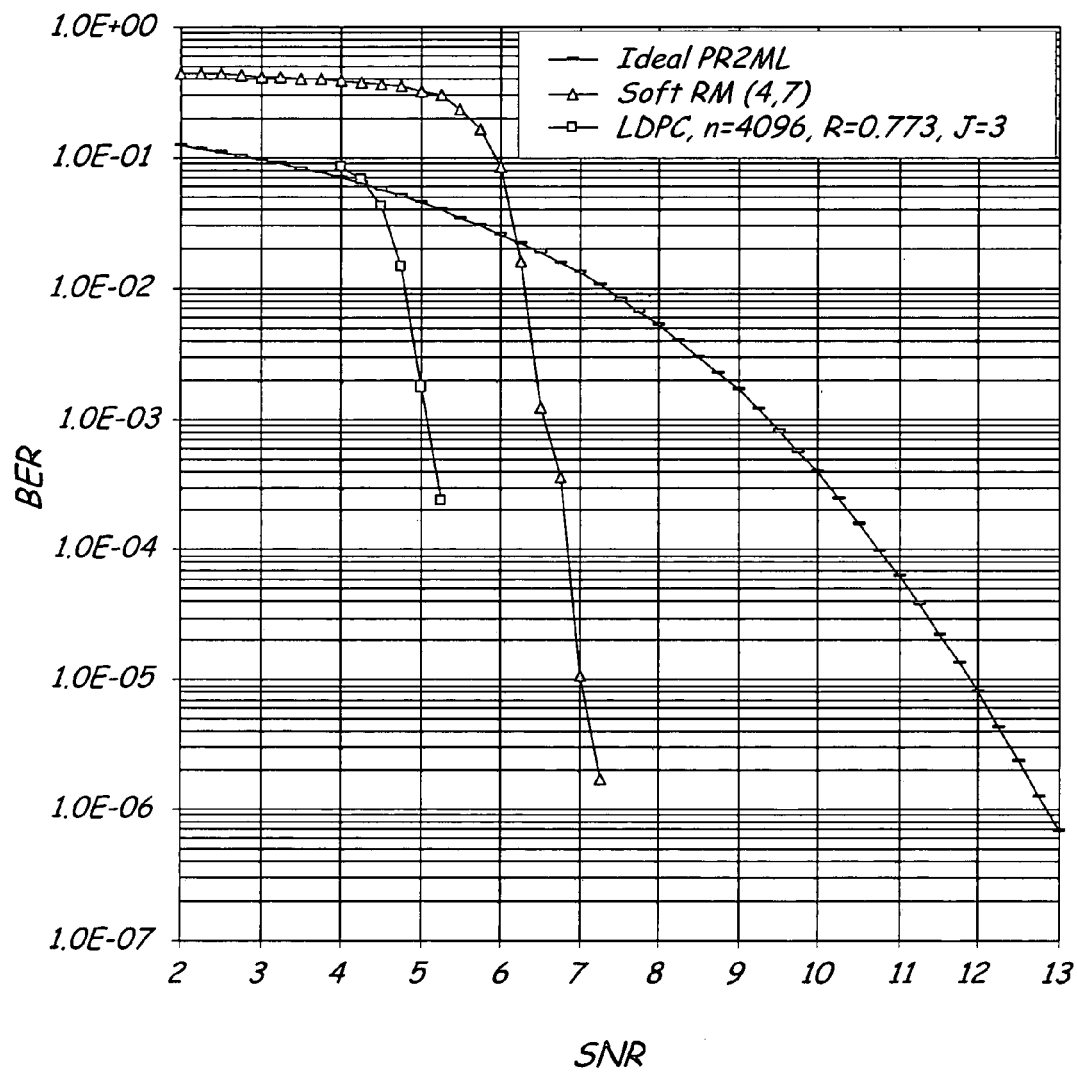
FIG. 14 is a graph of the bit-error rate versus the signal to noise ratio of RM(4,7) code and random LDPC code with the same code rate and codeword length.
Figure 15:
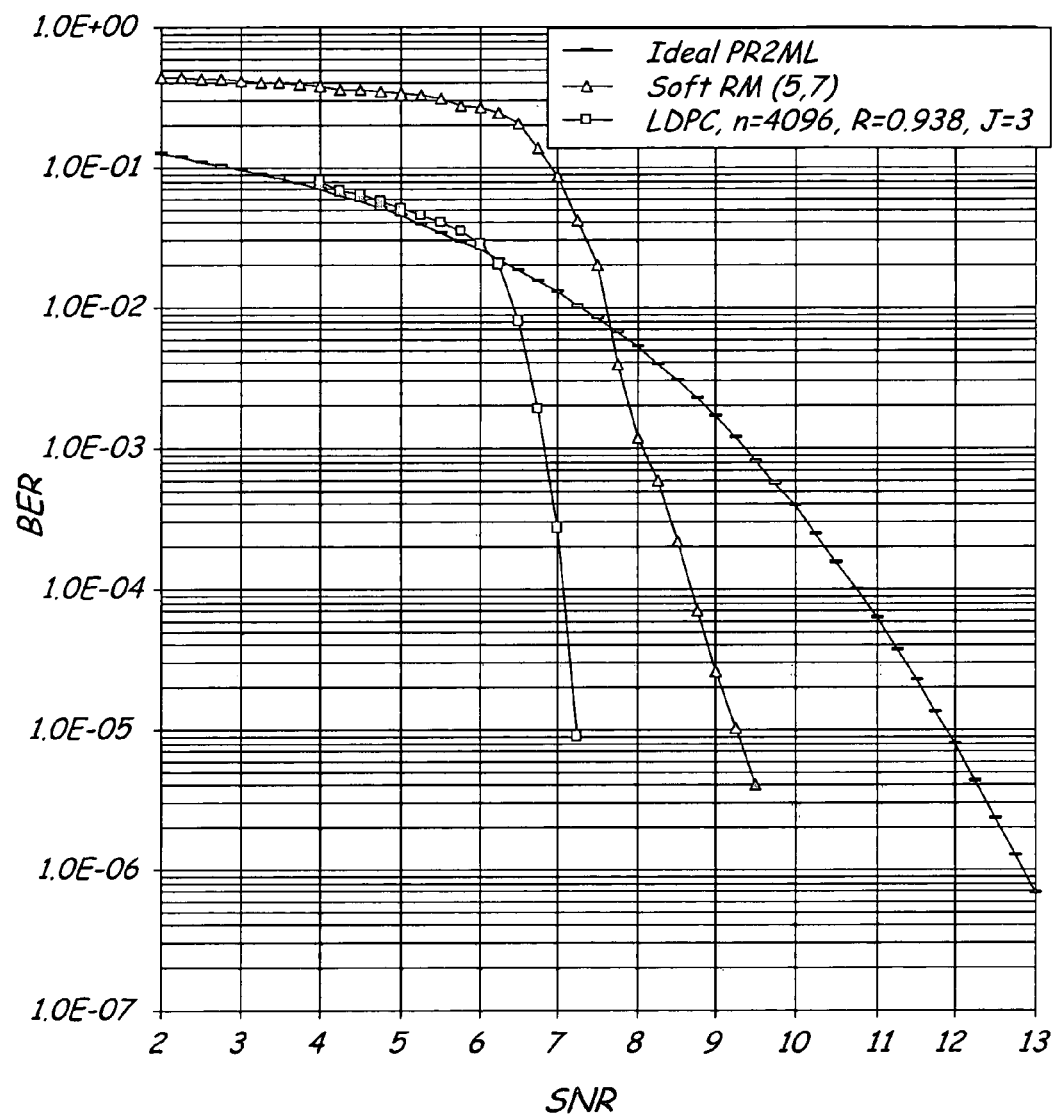
FIG. 15 is a graph of the bit-error rate versus the signal to noise ratio of RM(5,7) code and random LDPC code with the same code rate and codeword length.

FIGS. 14 and 15 compare the performance of RM codes with random LDPC codes at the code rates of 0.773 (low) and 0.938 (high), respectively. The LDPC codes serve as a reference because the random LDPC codes are known to achieve good results when decoded by the message passing algorithm.

As shown in FIG. 14, the difference between the random LDPC and the soft-iterative RM decoder was about 1.5 dB. The RM(4,7) code has a codeword length of 128 bits, while the LDPC code has a codeword length of 4096 bits. The RM(4,7) code can be decoded relatively quickly because the codeword is short. Additionally, the structure can be much simpler than the LDPC decoder, in part, because the decoder structure can be used repeatedly in a sector to decode the entire sector. Thus, the soft-iterative decoder offers an alternative to the performance-complexity tradeoff between the random LDPC and the structure LDPC.

FIG. 15 illustrates the RM(5,7) code relative to a random LDPC code having the same rate and codeword length. As shown, the soft Reed-Muller code performs better than the un-coded system, but about 2.3 dB worse than the LDPC code with n=4096 and a high code rate.

It will be understood by a worker skilled in the art that the theory set out in detail above may be used to code information, regardless of the destination. Since the Reed-Muller soft-iterative decoding system performs so well in terms of its BER relative to the SNR because the iterative process allows the decoder to occupy a relatively smaller circuit footprint, RM codes may be used to code information over physical wires, as well as between a magnetic read/write head and rotating disc. A worker skilled in the art will recognize that the iterative decoding system of the present invention has numerous applications.

Although the present invention has been described with reference to preferred embodiments, workers skilled in the art will recognize that changes may be made in form and detail without departing from the spirit and scope of the invention.

The invention claimed is:

1. A system for decoding channel signals having therein Reed-Muller coded information comprising:
   a plurality of soft-output devices, including first and second soft-output devices, for processing coded signals received thereby and for providing estimated values for code bits represented in received coded signals and for providing code bits reliabilities based on the received coded signals, the first soft-input device for providing initial stage code bits estimated values and corresponding initial stage code bits reliabilities from corresponding channel coded signals;
   a first Reed-Muller message passing device coupled to the first soft-output device for decoding the initial stage code bits estimated values and for using the initial stage code bits reliabilities to provide estimated values of message bits and to provide corresponding initial stage message bits reliabilities therefrom;
   an assembler coupled to the first Reed-Muller message passing device for converting the initial stage message bits reliabilities to subsequent stage incoming code bits reliabilities corresponding to code bits in the corresponding channel coded signal; and
   the second soft-input device coupled to said assembler for providing subsequent stage code bits estimated values and for providing subsequent stage outgoing code bits reliabilities from the corresponding channel coded signal and the corresponding subsequent stage incoming code bits reliabilities.

2. The system of claim 1 further comprising
   a plurality of Reed-Muller message passing devices, including the first Reed-Muller message passing device and a second Reed-Muller message passing device, the second Reed-Muller message passing device coupled to the second soft-output device for decoding the subsequent stage code bits estimated values and for using the subsequent stage outgoing code bits reliabilities to provide corresponding subsequent stage message bits reliabilities therefrom.

3. The system of claim 2 wherein the assembler coupled to the first Reed-Muller message passing device is a first assembler and the second Reed-Muller message passing device also provides subsequent stage message bits reliabilities corresponding to the estimated values of the subsequent stage message bits, and further comprising a second assembler, the second assembler coupled to the second Reed-Muller message passing device for converting the subsequent stage message bits reliabilities to next stage incoming code bits reliabilities corresponding to code bits in the corresponding channel coded signal; and the plurality of soft-output devices having a third soft-output device, the third soft-input device coupled to said second assembler for providing next stage code bits estimated values and for providing next stage outgoing code bits reliabilities from the corresponding channel coded signal and the corresponding next stage incoming code bits reliabilities, and the plurality of Reed-Muller message passing devices having a third Reed-Muller message passing device, the third Reed-Muller message passing device coupled to the third soft-output device for decoding the next stage code bits estimated values and for using the next stage outgoing code bits reliabilities to provide next stage message bits reliabilities.

4. The system of claim 1 wherein the channel coded signal is an interleaved coded signal, the system further comprising a de-interleaver coupling the first soft-output device and the first Reed-Muller message passing device for de-interleavering the initial stage code bits estimated values prior to the decoding thereof by the first Reed Muller message passing device.

5. The system of claim 1 wherein the first Reed-Muller message passing device provides the initial stage code bits reliabilities and the subsequent stage incoming and outgoing code bits reliabilities as log-bit likelihoods.

6. A method for decoding of a channel signal having messages encoded using a Reed-Muller code comprising:
  generating a initial stage code bits estimated values and corresponding initial stage code bits reliabilities represented log-bit likelihoods from corresponding channel coded signals using a first soft-output device;
  decoding the initial stage code bits estimated values and using the initial stage code bits reliabilities in a first Reed-Muller message passing device to provide therefrom estimated values of initial stage message bits and corresponding initial stage message bits reliabilities represented by log-bit likelihoods;
  passing at least a representation of the initial stage message bits reliabilities to a second soft-output device; and
  generating subsequent stage code bits estimated values and corresponding subsequent stage code bits outgoing reliabilities from the corresponding channel coded signal and the representation of the corresponding initial stage message bits reliabilities using the second soft-output device.

7. The method of claim 6 wherein the coded signal is an interleaved signal, the method further comprising de-interleaving the initial stage code bits estimated values and corresponding initial stage code bits reliabilities.

8. The method of claim 7 further comprising converting and interleaving the initial stage message bits reliabilities to subsequent stage incoming code bits reliabilities corresponding to code bits in the corresponding channel coded signal as the representation of the initial stage message bits reliabilities.

9. The method of claim 6 and further comprising decoding the subsequent stage code bits estimated values and using the subsequent stage outgoing code bits reliabilities in a second Reed-Muller message passing device to provide therefrom estimated values of subsequent stage message bits and corresponding subsequent stage message bits reliabilities.

10. The method of claim 9 further comprising passing at least a representation of the subsequent stage message bits reliabilities to a third soft-output device and generating next stage code bits estimated values and corresponding next stage code bits outgoing reliabilities from the corresponding channel coded signal and the representation of the corresponding subsequent stage message bits reliabilities using the third soft-output device.

11. A soft iterative decoding system for decoding channel signals having therein Reed-Muller coded information comprising:
  a plurality of decoding blocks for processing coded information into decoded message bits estimated values and message bits reliabilities represented by log-bit likelihoods, each decoding block comprising:
    a soft-output device for receiving the channel signals with the coded information and receiving any incoming code bits reliabilities, and for providing codeword bits estimated values and corresponding outgoing code bits reliabilities represented by log-bit likelihoods therefrom; and
    a Reed-Muller decoding device for decoding the code bits estimated values and for using the code bits reliabilities to provide estimated values of message bits and to provide corresponding message bits reliabilities represented by log-bit likelihoods therefrom; and
  an assembler device coupling an initial coding block to a subsequent decoding block for converting the message bits reliabilities from the initial decoding block to incoming code bits reliabilities represented by log-bit liklihoods corresponding to code bits in the corresponding channel coded signal for the subsequent decoding block.

12. The system of claim 11 wherein the coded information is interleaved, the system further comprises a de-interleaver coupling a soft-output device to a Reed-Muller decoding device in a decoding block for de-interleavering the code bits estimated values prior to the decoding thereof by the Reed Muller decoding device.

13. The system of claim 11 wherein the coded information is interleaved, the system further comprising an interleaver in the assembler for reordering the message bits reliabilities.

14. The system of claim 11 wherein the soft-output device of each of the plurality of decoding blocks has two inputs, a first input for receiving the channel signals having therein the coded information and a second input for receiving code bits reliabilities represented by log-bit likelihoods, and wherein each such soft-output device has two outputs for providing at one the code bits estimated values and at the other the corresponding code bits reliabilities represented by log-bit likelihoods.

15. The system of claim 14 wherein the second input of the soft-output device of a decoding block of the plurality of decoding blocks having only its outputs coupled to another decoding block receives none or only zero values.

16. The system of claim 11 further comprising another an assembler device coupling at least the subsequent coding block to a next decoding block for converting the message bits reliabilities from the subsequent decoding block to incoming code bits reliabilities represented by log-bit likelihoods corresponding to code bits in the corresponding channel coded signal for the next decoding block.

17. A method of decoding channel signals containing information in message bits encoded using Reed-Muller codes to provide code bits implemented by a message passing algorithm based on a Reed Graph, the method comprising:
- determining initial message bit likelihoods for each message bit in an initial code bit sequence of a corresponding Reed-Muller coded channel signal;
- determining subsequent code bit likelihoods based on the message bit likelihoods; and
- determining subsequent message bit likelihoods based on the subsequent code bit likelihoods and the Reed-Muller coded channel signal.

18. The method of claim 17 wherein the method is repeated to improve decoding accuracy.

19. The method of claim 17 wherein the message bit likelihoods and the code bit likelihoods are log-bit likelihoods.

20. A iterative decoding system for decoding a received channel signal containing Reed-Muller encoded information, the system comprising:
- a sequence of decoding blocks for processing the received signal into a decoded signal, each decoding block comprising:
  - a soft output device for processing the encoded information from the encoded signal into code bits and associated code bit likelihoods; and
  - a Reed-Muller message passing device for processing the code bits and the associated code bit likelihoods into message bits and message bit likelihoods; and
- coupling means between an output of the Reed-Muller message passing device in a decoding block and an input for a soft-output device in the next decoding block in the sequence, wherein a decoding block in the sequence coupled to other decoding blocks in the sequence only by its soft-output device produces the decoded signal.

21. The iterative decoding system of claim 20 wherein the message bit likelihoods corresponding to a message bit are represented as log likelihood ratios.

22. The iterative decoding system of claim 20 wherein the received channel signal is an interleaved signal, the system further comprising a de-interleaver disposed both between each soft-output device and each Reed-Muller message passing device and an interleaver disposed between consecutive decoding blocks in the sequence of decoding blocks.

23. The iterative decoding system of claim 20 wherein the system is implemented in a circuit.

24. The iterative decoding system of claim 20 wherein the connections are logical connections.

* * * * *

UNITED STATES PATENT AND TRADEMARK OFFICE
CERTIFICATE OF CORRECTION

PATENT NO. : 7,331,012 B2
APPLICATION NO. : 10/634723
DATED : February 12, 2008
INVENTOR(S) : Bane Vasic et al.

It is certified that error appears in the above-identified patent and that said Letters Patent is hereby corrected as shown below:

At col. 6, lines 28–31, please delete:
"0*(1111111111111111)+1*(0000000011111111)+1*(0000111100001111)+0*(0011001100110011)+
0*(0000000000001111)+0*(0000000000110011)+0*(0000000001010101)=(0000111111110000)."
    and insert therefore:
-- 0*(1111111111111111)+1*(0000000011111111)+1*(0000111100001111)+0*(0011001100110011)+
0*(0101010101010101)+0*(0000000000001111 )+0*(0000000000110011)+
0*(0000000001010101)=(0000111111110000). --

At col. 8, lines 46–59, please delete:
"FIG. 3 illustrates a communication circuit 10 according to the present invention. The communication circuit 10 includes an RM-encoder 12, a partial-response channel 14, and a Reed-Muller partial response decoder 16 (RM-PR 16). For simplicity, a transmission of a single codeword $m$ is shown, though the same principle of operation holds for every message word transmitted. As shown, codeword $m$ is input into the RM encoder 12, which generates an RM-encoded codewordx. RM-encoded codewordx is transmitted over the Partial-Response (PR) channel 14, which tends to introduce noise to the codewordx such that the received codewordy contains unknown errors. As shown, the received codeword $y$ is input into the RM-PR decoder 16, which produces an output decoded codeword."
    and insert therefore:
-- FIG. 3 illustrates a communication circuit 10 according to the present invention. The communication circuit 10 includes an RM-encoder 12, a partial-response channel 14, and a Reed-Muller partial response decoder 16 (RM-PR 16). For simplicity, a transmission of a single codeword $m$ is shown, though the same principle of operation holds for every message word transmitted. As shown, codeword $m$ is input into the RM encoder 12, which generates an RM-encoded codeword $x$. RM-encoded codeword $x$ is transmitted over the Partial-Response (PR) channel 14, which tends to introduce noise to the codeword $x$ such that the received codeword $y$ contains unknown errors. As shown, the received codeword y is input into the RM-PR decoder 16, which produces an output decoded codeword. --

At col. 9, lines 15–16, please delete:
"The interleaver 18 orders re-orders the RM-encoded codeword $x$ prior to passing the codeword $x$ to the partial-response channel 14."
    and insert therefore:

Signed and Sealed this

Seventh Day of December, 2010

David J. Kappos
*Director of the United States Patent and Trademark Office*

CERTIFICATE OF CORRECTION (continued)
U.S. Pat. No. 7,331,012 B2

-- The interleaver 18 randomly re-orders the RM-encoded codeword $x$ prior to passing the codeword $x$ to the partial-response channel 14. --

At col. 10, lines 42–46, please delete:

"The BCJR or SOVA device 20A has no initial reliability vector $\lambda(\hat{m})$ associated with the received code word $y$, so the second input of the BCJR or SOVA device 20A is a reliability vector $\lambda(\hat{x})$ of value zero, providing no indication of reliability."
    and insert therefore:

-- The BCJR or SOVA device 20A has no initial reliability vector $\lambda(\hat{x})$ associated with the received code word $y$, so the second input of the BCJR or SOVA device 20A is a reliability vector $\lambda(\hat{x})$ of value zero, providing no indication of reliability. --

At col. 11, lines 34–35, please delete:
"corresponding to $G_j$ (with) message word bits $x_s^{(j)}$ having index s such that"
    and insert therefore:
-- corresponding to $G_j$ (with message word bits $x_s^{(j)}$ having index s such that --

At col. 11, lines 50–57, please delete:
"In each array $P_s$, each column shows the locations of the code bits to be added together to give an estimation of the message bit $x_s$. This addition is modulo-2 addition. In the hard-coding version, the message bit is determined by a majority vote among all $2^{m-j}$ estimations, (as described above), and the received code vector is updated according to the relation y ← y×x$^{(j)}$G$_j$, and then passed to the next decoding step (step j×1)."
    and insert therefore:
-- In each array $P_s$, each column shows the locations of the code bits to be added together to give an estimation of the message bit $x_s^{(j)}$. This addition is modulo-2 addition. In the hard-coding version, the message bit is determined by a majority vote among all $2^{m-j}$ estimations, (as described above), and the received code vector is updated according to the relation y ← y + x$^{(j)}$G$_j$, and then passed to the next decoding step (step j+1). --

At col. 11, lines 62–64, please delete:

" $$LLR(b_s) = \log\left(\frac{Probability(b_s = +1|y)}{Probability(b_s = -1|y)}\right)$$ ,, and insert therefore:

$$LLR(b_s) = \log\left(\frac{Probability(b_s = +1/y)}{Probability(b_s = -1/y)}\right)$$

-- --

CERTIFICATE OF CORRECTION (continued)
U.S. Pat. No. 7,331,012 B2

At col. 12, lines 5–32, please delete:

"
$$\mu(\hat{m}_s^{i,j}) = -S_s^{i,j} \cdot \log\left\{-\tanh\left(\frac{A_s^{i,j}}{2}\right)\right\} \quad (1)$$

$$S_s^{i,j} = \prod_l sign\{\mu(\hat{x}_l^{i,j,s})\} \quad (2)$$

where $\mu(\hat{x}_l^{i,j,k})$ is the LLR of the expression for the s-th message bit from the i-th equation in the j-th level, and where $$A_s^{i,j} = \sum_l \log\left|\tanh\left(\frac{\mu(\hat{x}_l^{i,j,s})}{2}\right)\right|. \quad (3)$$

and"

At col. 12, lines 5–32, please insert therefore:

--
$$\mu(\hat{m}_s^{i,j}) = -S_s^{i,j} \cdot \log\left\{-\tanh\left(\frac{A_s^{i,j}}{2}\right)\right\} \quad (1)$$

where $\mu(\hat{x}_l^{i,j,s})$ is the LLR of the expression for the s-th message bit from the i-th equation in the j-th level, and where $$S_s^{i,j} = \prod_l sign\{\mu(\hat{x}_l^{i,j,s})\} \quad (2)$$

and $$A_s^{i,j} = \sum_l \log\left|\tanh\left(\frac{\mu(\hat{x}_l^{i,j,s})}{2}\right)\right|. \quad (3)$$
--

At col. 12, lines 56–63, please delete:
"In the hard decoding version (Reed algorithm), a message bit is determined by a majority vote, and the received code vector is updated using the expression $y \leftarrow y \times x^{(j)} G_{j}$ given above, and then passed to the next decoding step. In the soft decoding version, prior to advancing to the next row of the decoder 16, the updated message bit likelihoods must be converted to the code bit likelihoods. This conversion is performed based on the submatrix $G_j$."
  and insert therefore:

CERTIFICATE OF CORRECTION (continued)
U.S. Pat. No. 7,331,012 B2

-- In the hard decoding version (Reed algorithm), a message bit is determined by a majority vote, and the received code vector is updated using the expression $y \leftarrow y + x^{(j)} G_j$ given above, and then passed to the next decoding step. In the soft decoding version, prior to advancing to the next row of the decoder 16, the updated message bit likelihoods must be converted to the code bit likelihoods. This conversion is performed based on the submatrix $G_j$. --

At col. 13, lines 26–27, please delete:
"Suppose that the nonzero positions of the 1-th column of $G_j$ are given by the set $\{l_1 \ldots 1\}$ where"
 and insert therefore:
-- Suppose that the nonzero positions of the 1-th column of $G_j$ are given by the set $\{l_l \ldots l_t\}$ where --

At col. 13, lines 63–65, please delete: "$$\lambda(\hat{x}_l) = \left[\prod_j sign\{u(\hat{m}_{lj})\}\right] \cdot \min_j \{|\mu(m_{lj})|\}$$"

and insert therefore: -- $$\lambda(\hat{x}_l) = \left[\prod_j sign\{\mu(\hat{m}_{lj})\}\right] \cdot \min_j \{|\mu(m_{lj})|\}$$ --

At col. 14, lines 46–56, please delete: "
$$m_{10} = c_0 + c_1 + c_{2+c3}$$
$$m_{10} = c_4 + c_5 + c_{6+c7}$$
$$m_{10} = c_8 + c_9 + c_{10+c11}$$
$$m_{10} = c_{12} + c_{13} + c_{14+c15}$$
"

and insert therefore: --
$$m_{10} = c_0 + c_1 + c_2 + c_3$$
$$m_{10} = c_4 + c_5 + c_6 + c_7$$
$$m_{10} = c_8 + c_9 + c_{10} + c_{11}$$
$$m_{10} = c_{12} + c_{13} + c_{14} + c_{15}$$
 --

At col. 14, lines 63–66, please delete: "$$P_{10} = \begin{bmatrix} 0 & 4 & 8 & 12 \\ 1 & 5 & 9 & 13 \\ 2 & 6 & 10 & 14 \\ 3 & 7 & 11 & 15 \end{bmatrix}$$"

CERTIFICATE OF CORRECTION (continued)
U.S. Pat. No. 7,331,012 B2

$$P_{10} = \begin{bmatrix} 0 & 4 & 8 & 12 \\ 1 & 5 & 9 & 13 \\ 2 & 6 & 10 & 14 \\ 3 & 7 & 11 & 15 \end{bmatrix}$$

and insert therefore: -- --

Note that the first column of $P_{10}$ is a set of indices from the first expression (10) above, and the other columns represent sets of indices from expressions (11)-(13).

At col. 15, lines 10–15, please delete: " $$P_5 = \begin{bmatrix} 0 & 4 & 8 & 12 \\ 1 & 5 & 9 & 12 \\ 2 & 6 & 10 & 14 \\ 3 & 7 & 11 & 15 \end{bmatrix}$$ "

and insert therefore: -- $$P_5 = \begin{bmatrix} 0 & 4 & 8 & 12 \\ 1 & 5 & 9 & 13 \\ 2 & 6 & 10 & 14 \\ 3 & 7 & 11 & 15 \end{bmatrix}$$ --

At col. 15, lines 26–28, please delete: " $$P_1 = \begin{bmatrix} 0 & 1 & 2 & 3 & 4 & 5 & 6 & 7 \\ 8 & 9 & 10 & 11 & 12 & 13 & 14 & 15 \end{bmatrix}$$ "

and insert therefore: -- $$P_1 = \begin{bmatrix} 0 & 1 & 2 & 3 & 4 & 5 & 6 & 7 \\ 8 & 9 & 10 & 11 & 12 & 13 & 14 & 15 \end{bmatrix}$$

$$P_0 = [0\ 1\ 2\ 3\ 4\ 5\ 6\ 7\ 8\ 9\ 10\ 11\ 12\ 13\ 14\ 15]$$ --